(12) United States Patent
Yang et al.

(10) Patent No.: US 11,417,574 B2
(45) Date of Patent: Aug. 16, 2022

(54) SEMICONDUCTOR DEVICE WITH TESTING STRUCTURE AND METHOD FOR FABRICATING THE SAME

(71) Applicant: NANYA TECHNOLOGY CORPORATION, New Taipei (TW)

(72) Inventors: Tsang-Po Yang, New Taipei (TW); Jui-Hsiu Jao, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 17/084,058

(22) Filed: Oct. 29, 2020

(65) Prior Publication Data
US 2022/0139790 A1  May 5, 2022

(51) Int. Cl.
*H01L 21/66* (2006.01)
*H01L 27/108* (2006.01)

(52) U.S. Cl.
CPC ........ *H01L 22/32* (2013.01); *H01L 27/10814* (2013.01); *H01L 27/10823* (2013.01); *H01L 27/10855* (2013.01); *H01L 27/10876* (2013.01)

(58) Field of Classification Search
None
See application file for complete search history.

(56) References Cited

U.S. PATENT DOCUMENTS

| | | | |
|---|---|---|---|
| 6,891,216 B1* | 5/2005 | Huang | H01L 22/34 257/301 |
| 2004/0069989 A1* | 4/2004 | Wu | H01L 27/10864 257/48 |
| 2012/0268159 A1* | 10/2012 | Cho | H01L 27/10855 324/762.01 |
| 2015/0041809 A1* | 2/2015 | Arnold | H01L 21/84 257/48 |
| 2019/0244960 A1* | 8/2019 | Park | H01L 27/10814 |
| 2020/0227419 A1* | 7/2020 | Park | H01L 22/32 |
| 2021/0082809 A1* | 3/2021 | Kim | H01L 23/53295 |
| 2021/0175133 A1* | 6/2021 | Choi | H01L 22/34 |

* cited by examiner

*Primary Examiner* — Steven M Christopher
(74) *Attorney, Agent, or Firm* — Muncy, Geissler, Olds & Lowe, P.C.

(57) ABSTRACT

The present application discloses a semiconductor device and a method for fabricating the semiconductor device. The semiconductor device includes a first testing area, a word line structure positioned in the first testing area and arranged parallel to a first axis, a first column of capacitor contact structures positioned in the first testing area and arranged parallel to a second axis perpendicular to the first axis, a second column of capacitor contact structures positioned adjacent to the first column of capacitor contact structures and arranged parallel to the first column of capacitor contact structures, and a first testing structure including a first drain portion extended along the second axis and a first source portion extended along the second axis. The first drain portion is positioned on the first column of capacitor contact structures and the first source portion is positioned on the second column of capacitor contact structures.

16 Claims, 41 Drawing Sheets

SEMICONDUCTOR DEVICE WITH TESTING STRUCTURE AND METHOD FOR FABRICATING THE SAME

TECHNICAL FIELD

The present disclosure relates to a semiconductor device and a method for fabricating the semiconductor device, and more particularly, to a semiconductor device with a testing structure and a method for fabricating the semiconductor device with the testing structure.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a first testing area, a word line structure positioned in the first testing area and arranged parallel to a first axis, a first column of capacitor contact structures positioned in the first testing area and arranged parallel to a second axis perpendicular to the first axis, a second column of capacitor contact structures positioned adjacent to the first column of capacitor contact structures and arranged parallel to the first column of capacitor contact structures, and a first testing structure including a first drain portion extended along the second axis and a first source portion extended along the second axis. The first drain portion is positioned on the first column of capacitor contact structures and the first source portion is positioned on the second column of capacitor contact structures.

In some embodiments, the first testing area is positioned in a scribe line.

In some embodiments, the semiconductor device includes a second testing area positioned in the scribe line, a first row of capacitor contact structures positioned in the second testing area and arranged parallel to the first axis, a second row of capacitor contact structures positioned adjacent to the first row of capacitor contact structures and arranged parallel to the first row of capacitor contact structures, and a second testing structure including a second drain portion extended along the first axis and a second source portion extended along the first axis The second drain portion is positioned on the first row of capacitor contact structures and the second source portion is positioned on the second row of capacitor contact structures.

In some embodiments, the semiconductor device includes a third testing area positioned in the scribe line, a first slanted row of capacitor contact structures positioned in the third testing area and arranged parallel to a first direction slanted with respect to the first axis and the second axis, a second slanted row of capacitor contact structures positioned adjacent to the first slanted row of capacitor contact structures and arranged parallel to the first slanted row of capacitor contact structures, and a third testing structure including a third drain portion extended along the first direction and a third source portion extended along the first direction. The third drain portion is positioned on the first slanted row of capacitor contact structures and the third source portion is positioned on the second slanted row of capacitor contact structures.

In some embodiments, the semiconductor device includes a substrate. The first column of capacitor contact structures is positioned on the substrate and the word line structure is positioned in the substrate.

In some embodiments, the semiconductor device includes a substrate. The first column of capacitor contact structures is extended to an upper portion of the substrate and the word line structure is positioned in the substrate.

In some embodiments, the semiconductor device includes a bit line structure positioned between the first column of capacitor contact structures and the second column of capacitor contact structures.

In some embodiments, the semiconductor device includes an etching stop layer positioned between the bit line structure and the substrate.

In some embodiments, the semiconductor device includes bit line spacers positioned on sidewalls of the bit line structure.

In some embodiments, the bit line structure includes a bit line bottom conductive layer positioned on the substrate, a bit line middle conductive layer positioned on the bit line bottom conductive layer, a bit line top conductive layer positioned on the bit line middle conductive layer, and a bit line capping layer positioned on the bit line top conductive layer.

In some embodiments, the semiconductor device includes a bit line contact positioned under the bit line bottom conductive layer.

In some embodiments, the word line structure includes a word line dielectric layer inwardly positioned in the substrate, a word line bottom conductive layer positioned on the word line dielectric layer, a word line top conductive layer positioned on the word line bottom conductive layer, and a word line capping layer positioned on the word line top conductive layer.

In some embodiments, the semiconductor device includes drain regions positioned under the first column of capacitor contact structures.

In some embodiments, the first column of capacitor contact structures includes polycrystalline silicon, polycrystalline germanium, polycrystalline silicon germanium, titanium nitride, tantalum nitride, cobalt silicide, titanium silicide, nickel silicide, nickel platinum silicide, or tantalum silicide.

Another aspect of the present disclosure provides a semiconductor device including a second testing area positioned in a scribe line, a word line structure positioned in the second testing area and arranged parallel to a first axis, a bit line structure positioned in the second testing area and arranged parallel to a second axis perpendicular to the first axis, a first row of capacitor contact structures positioned in the second testing area and arranged parallel to the first axis, a second row of capacitor contact structures positioned adjacent to the first row of capacitor contact structures and arranged parallel to the first row of capacitor contact structures, and a second testing structure including a second drain portion extended along the first axis and a second source portion extended along the first axis. The second drain portion is positioned on the first row of capacitor contact structures and the second source portion is positioned on the second row of capacitor contact structures.

Another aspect of the present disclosure provides a semiconductor device including a third testing area positioned in a scribe line, a word line structure positioned in the third testing area and arranged parallel to a first axis, a bit line structure positioned in the third testing area and arranged parallel to a second axis perpendicular to the first axis, a first slanted row of capacitor contact structures positioned in the third testing area and arranged parallel to a first direction slanted with respect to the first axis and the second axis, a second slanted row of capacitor contact structures positioned adjacent to the first slanted row of capacitor contact structures and arranged parallel to the first slanted row of capacitor contact structures, and a third testing structure including a third drain portion extended along the first direction and a third source portion extended along the first direction. The third drain portion is positioned on the first slanted row of capacitor contact structures and the third source portion is positioned on the second slanted row of capacitor contact structures.

In some embodiments, the semiconductor device includes a first testing area positioned in the scribe line, a first column of capacitor contact structures positioned in the first testing area and arranged parallel to the second axis, a second column of capacitor contact structures positioned adjacent to the first column of capacitor contact structures and arranged parallel to the first column of capacitor contact structures, and a first testing structure including a first drain portion extended along the second axis and a first source portion extended along the second axis. The first drain portion is positioned on the first column of capacitor contact structures and the first source portion is positioned on the second column of capacitor contact structures.

Another aspect of the present disclosure provides a method for fabricating a semiconductor device including providing a substrate, forming a word line structure in the substrate and arranged parallel to a first axis, forming a first column of capacitor contact structures on the substrate and arranged parallel to a second axis perpendicular to the first axis and forming a second column of capacitor contact structures adjacent to the first column of capacitor contact structures and arranged parallel to the first column of capacitor contact structures, and forming a first drain portion extended along the second axis and on the first column of capacitor contact structures and forming a first source portion extended along the second axis and on the second column of capacitor contact structures. The first drain portion and the first source portion together form a first testing structure.

In some embodiments, the first drain portion and the first source portion are formed of copper, aluminum, or a combination thereof.

In some embodiments, the first column of capacitor contact structures includes polycrystalline silicon, polycrystalline germanium, polycrystalline silicon germanium, titanium nitride, tantalum nitride, cobalt silicide, titanium silicide, nickel silicide, nickel platinum silicide, or tantalum silicide.

Due to the design of the semiconductor device of the present disclosure, leakage between adjacent capacitor contact structures may be detected. As a result, the reliability and yield of the semiconductor device may be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
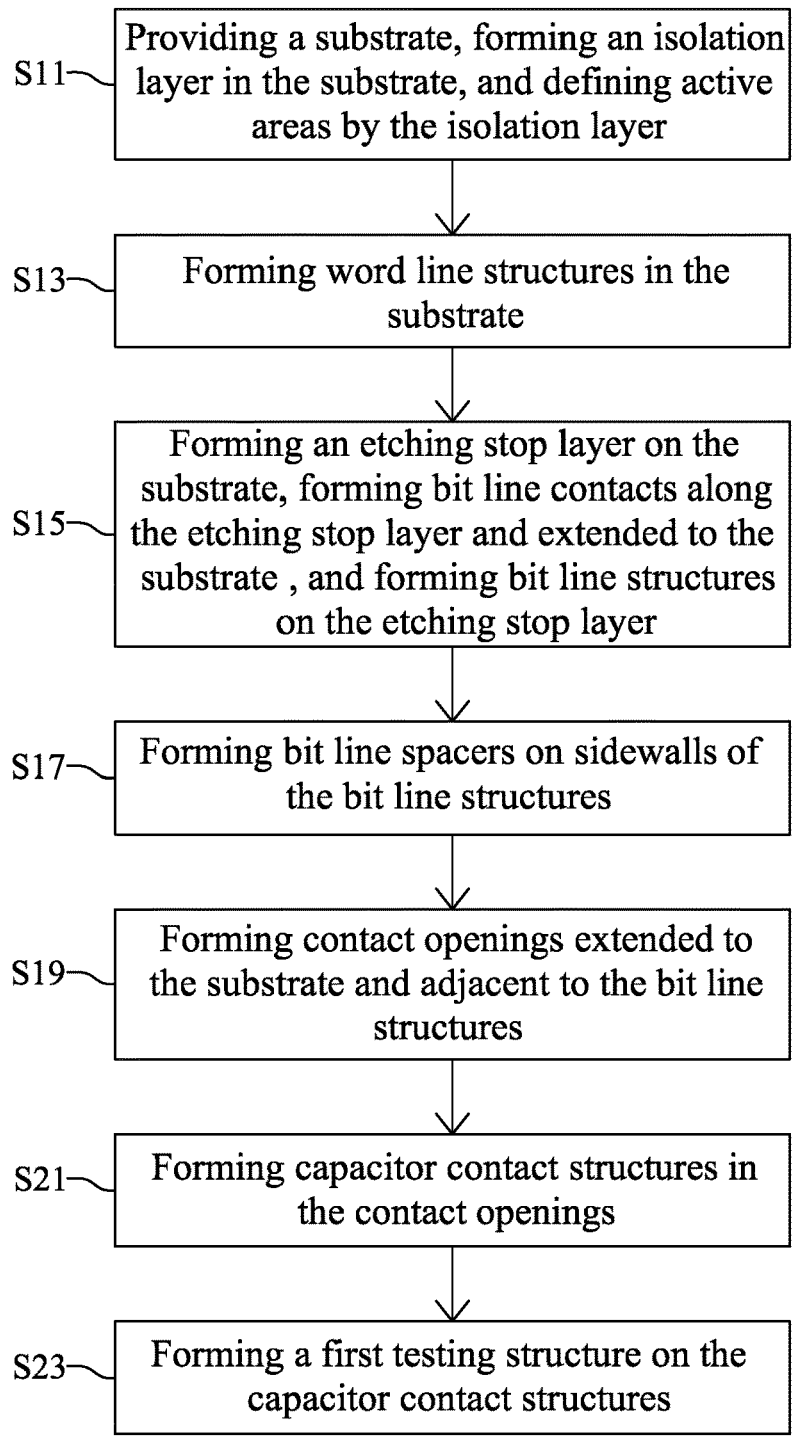
FIG. 1 illustrates, in a flowchart diagram form, a method for fabricating a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the axis Z, and below (or down) corresponds to the opposite direction of the arrow of the axis Z.

Figure 2:
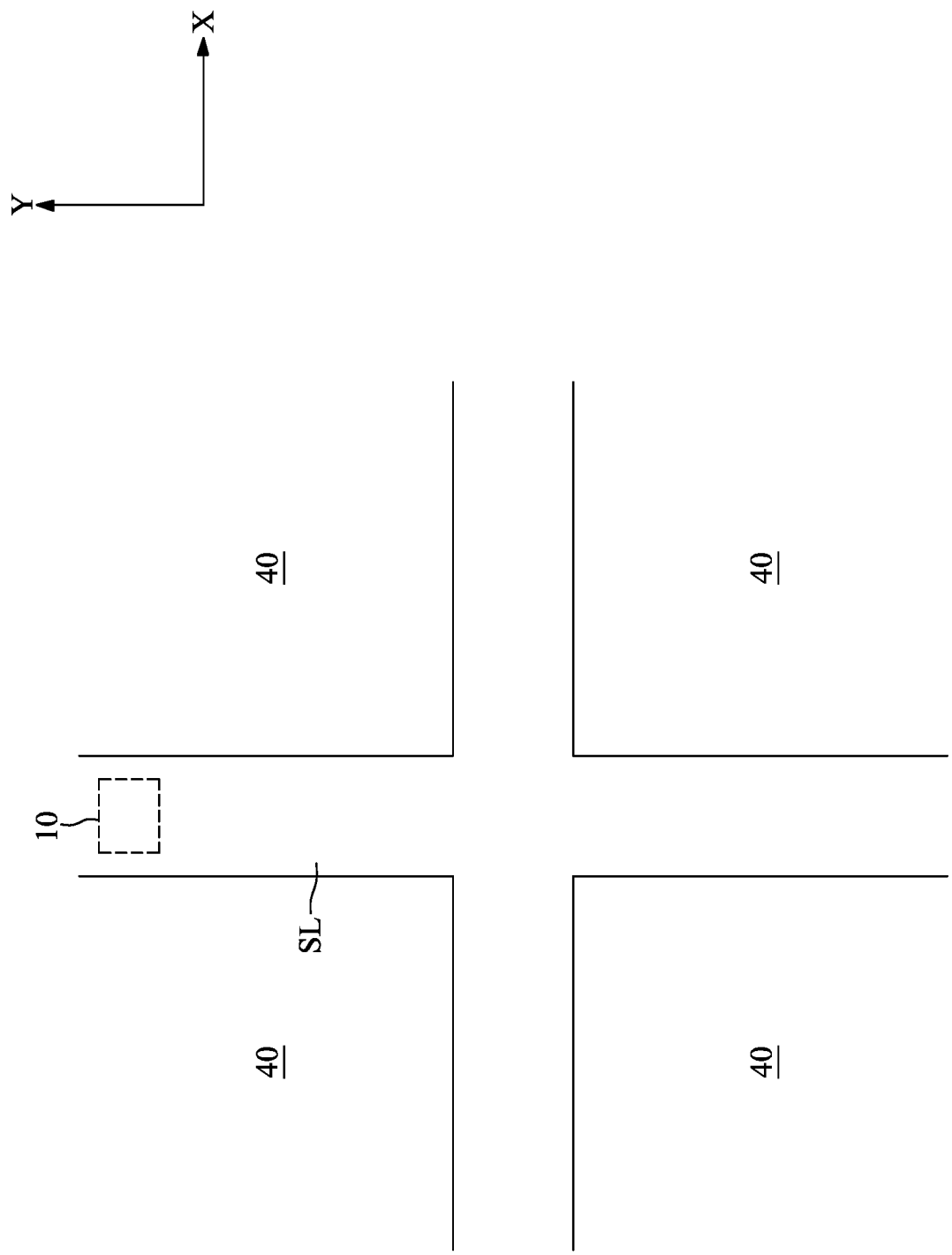
FIG. 2 illustrates, in a schematic top-view diagram, an intermediate semiconductor device in accordance with one embodiment of the present disclosure.
Figure 3:
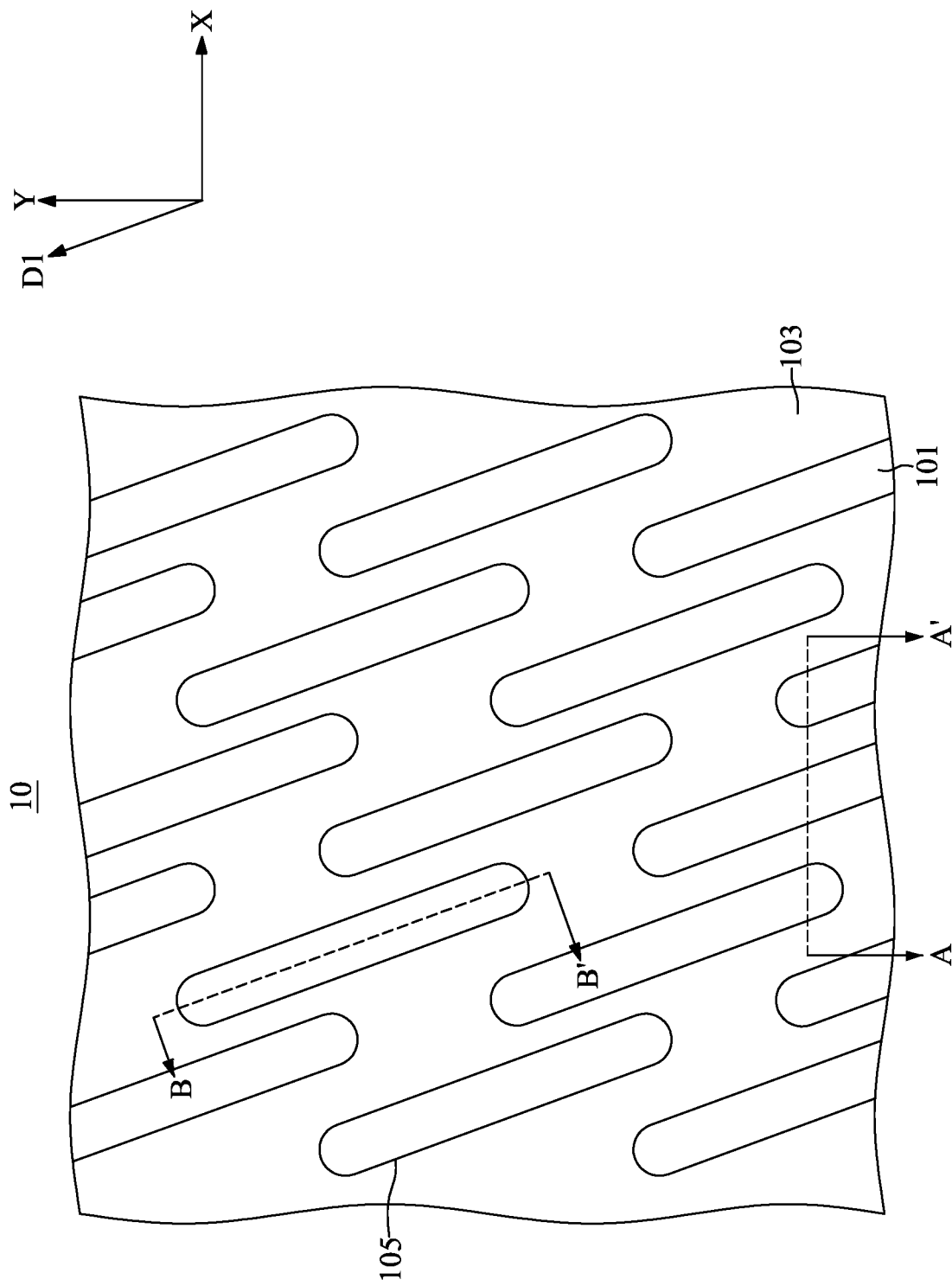
FIG. 3 illustrates, in a schematic close-up top-view diagram, a first testing area in FIG. 2.
Figure 4:
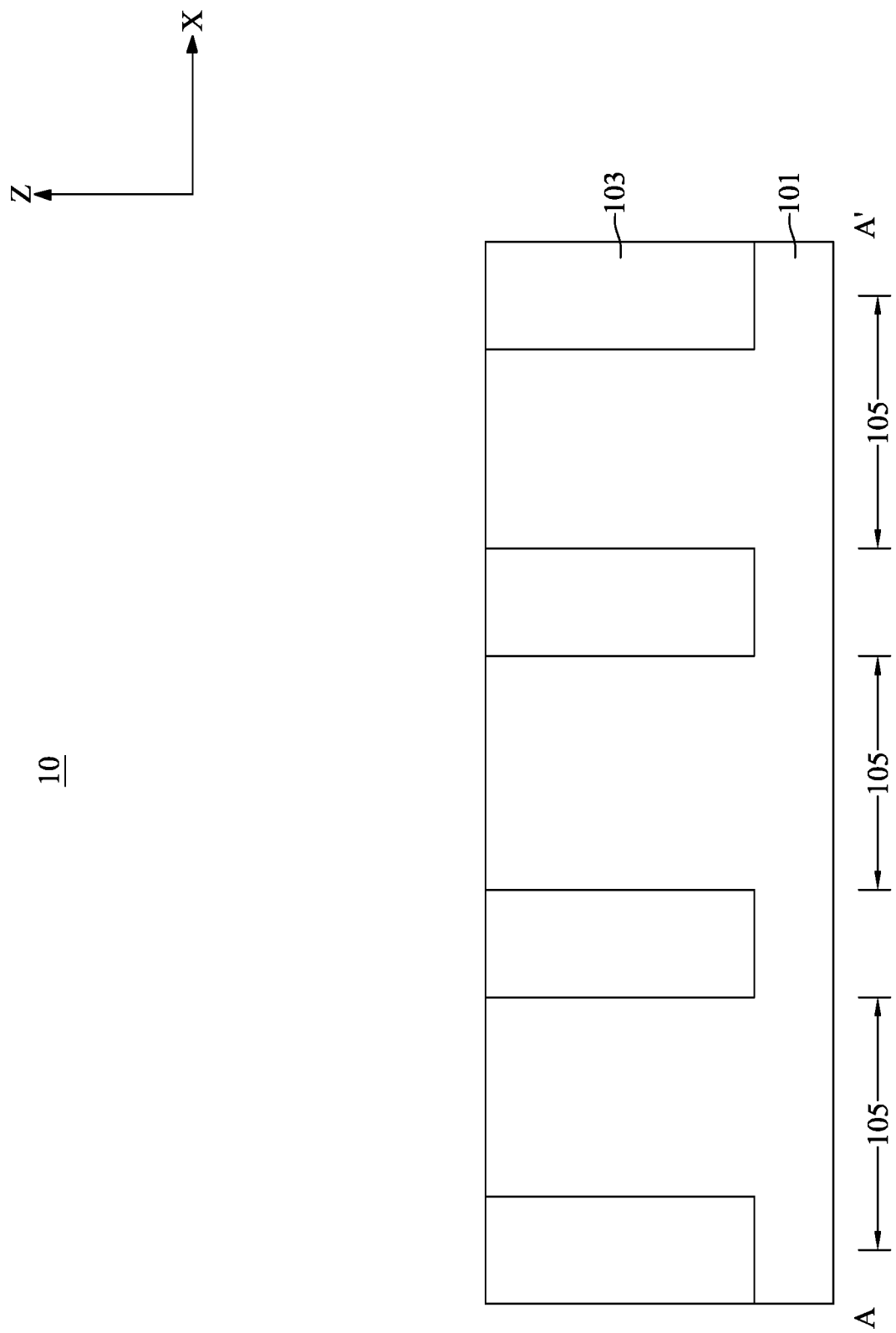
FIGS. 4 and 5 are schematic cross-sectional view diagrams respectively taken along the line A-A' and the line B-B' in FIG. 3.
Figure 5:
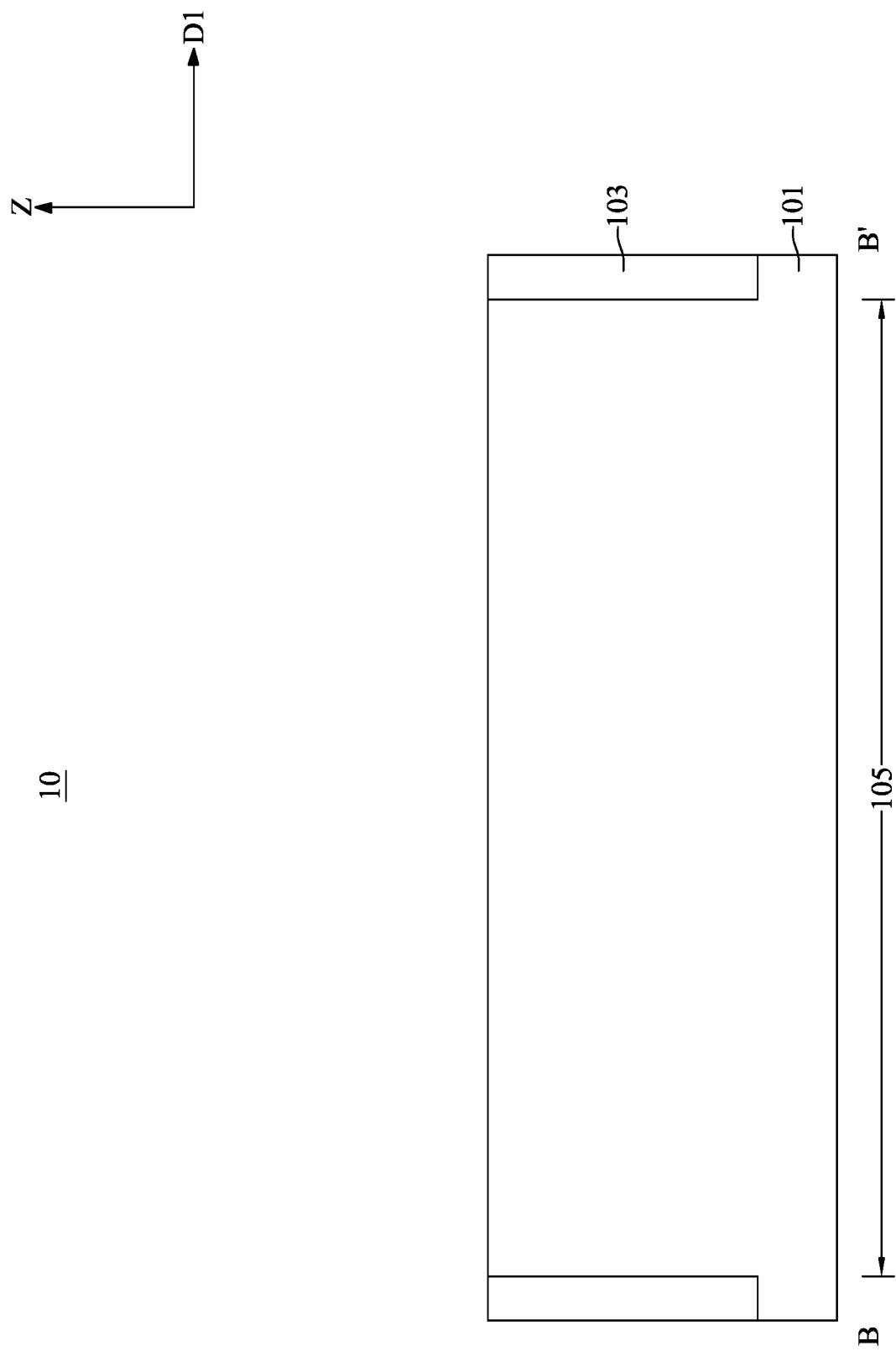

FIG. 1 illustrates, in a flowchart diagram form, a method 10 for fabricating a semiconductor device 1A in accordance with one embodiment of the present disclosure. FIG. 2 illustrates, in a schematic top-view diagram, an intermediate semiconductor device in accordance with one embodiment of the present disclosure. FIG. 3 illustrates, in a schematic close-up top-view diagram, a first testing area 10 in FIG. 2. FIGS. 4 and 5 are schematic cross-sectional view diagrams respectively taken along the line A-A' and the line B-B' in FIG. 3 illustrating part of a flow for fabricating the semiconductor device 1A in accordance with one embodiment of the present disclosure.

With reference to FIGS. 1 to 5, at step S11, a substrate 101 may be provided, an isolation layer 103 may be formed in the substrate 101, and active areas 105 may be defined by the isolation layer 103.

With reference to FIG. 2, in a top-view perspective, the semiconductor device 1A may include die areas 40 and scribe lines SL. The scribe lines SL may be located between the die areas 40. The scribe lines SL may be cut during wafer dicing. A first testing area 10 may be located in the scribe lines SL.

With reference to FIGS. 3 to 5, the substrate 101 may include an organic semiconductor or a layered semiconductor such as silicon/silicon germanium, silicon-on-insulator or silicon germanium-on-insulator. When the substrate 101 is formed of silicon-on-insulator, the substrate 101 may include a top semiconductor layer and a bottom semiconductor layer formed of silicon, and a buried insulating layer which may separate the top semiconductor layer from the bottom semiconductor layer. The buried insulating layer may include, for example, a crystalline or non-crystalline oxide, nitride or any combination thereof.

With reference to FIGS. 3 to 5, in a cross-sectional perspective, the isolation layer 103 may be formed in the substrate 101. The top surface of the isolation layer 103 may be substantially coplanar with the top surface of the substrate 101.

The isolation layer 103 may be formed of, for example, an insulating material such as silicon oxide, silicon nitride, silicon oxynitride, silicon nitride oxide, or fluoride-doped silicate. It should be noted that, in the present disclosure, silicon oxynitride refers to a substance which contains silicon, nitrogen, and oxygen and in which a proportion of oxygen is greater than that of nitrogen. Silicon nitride oxide refers to a substance which contains silicon, oxygen, and nitrogen and in which a proportion of nitrogen is greater than that of oxygen.

With reference to FIGS. 3 to 5, in a top-view perspective, the isolation layer 103 may surround portions of the substrate 101. The surrounded portions of the substrate 101 may be referred to as the active areas 105. The active areas 105 may be bar shapes. Each of the active areas 105 may extend in a tilted direction D1. The active areas 105 may be arranged along a first axis X and a second axis Y. The active areas 105 may be spaced apart from each other in the tilted direction D1. The first axis X and the second axis are perpendicular to each other. The tilted direction D1 may be slanted with respect to the first axis X and the second axis Y.

Figure 6:
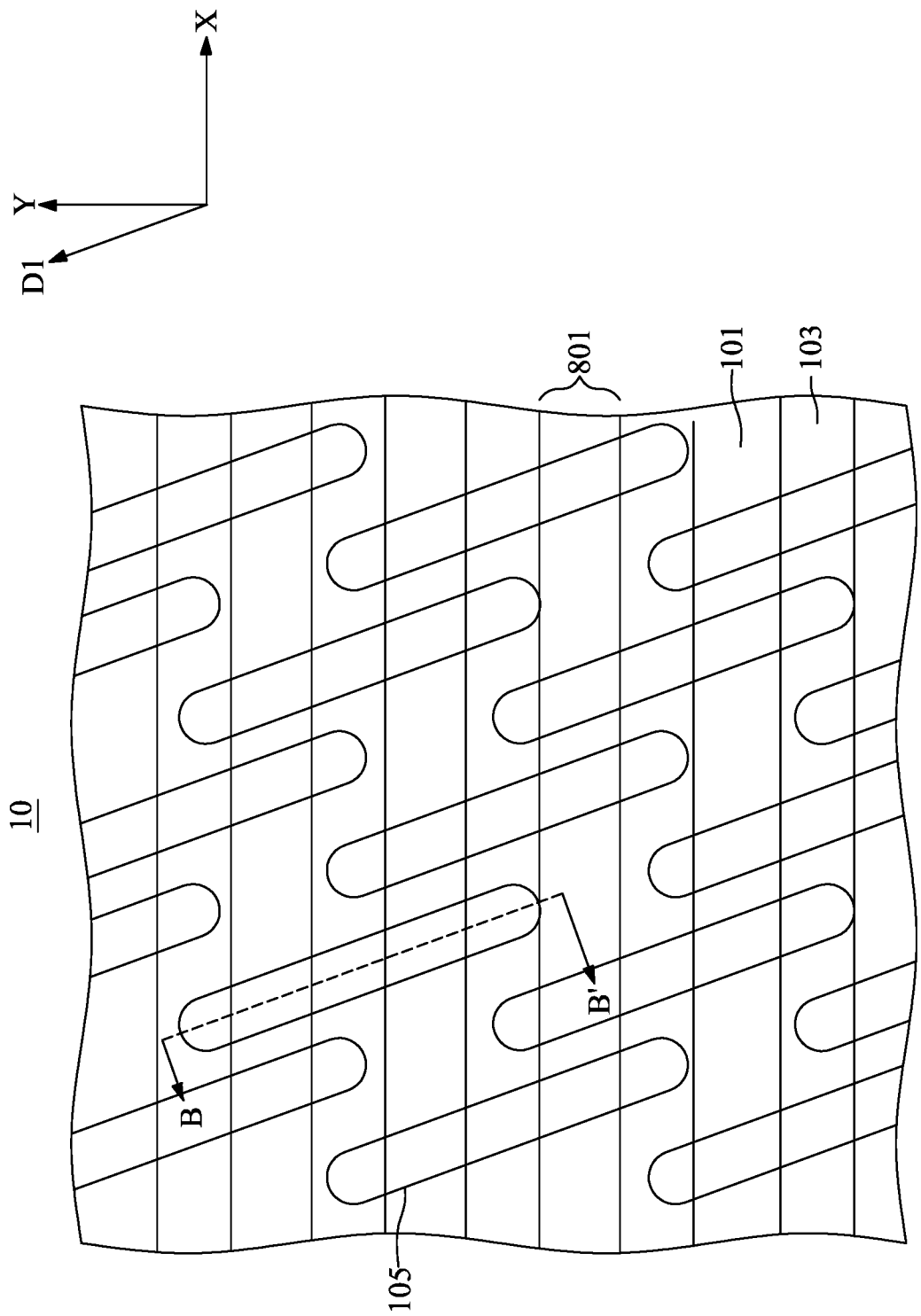
FIG. 6 illustrates, in a schematic close-up top-view diagram, an intermediate semiconductor device of the first testing area in accordance with one embodiment of the present disclosure.
Figure 7:
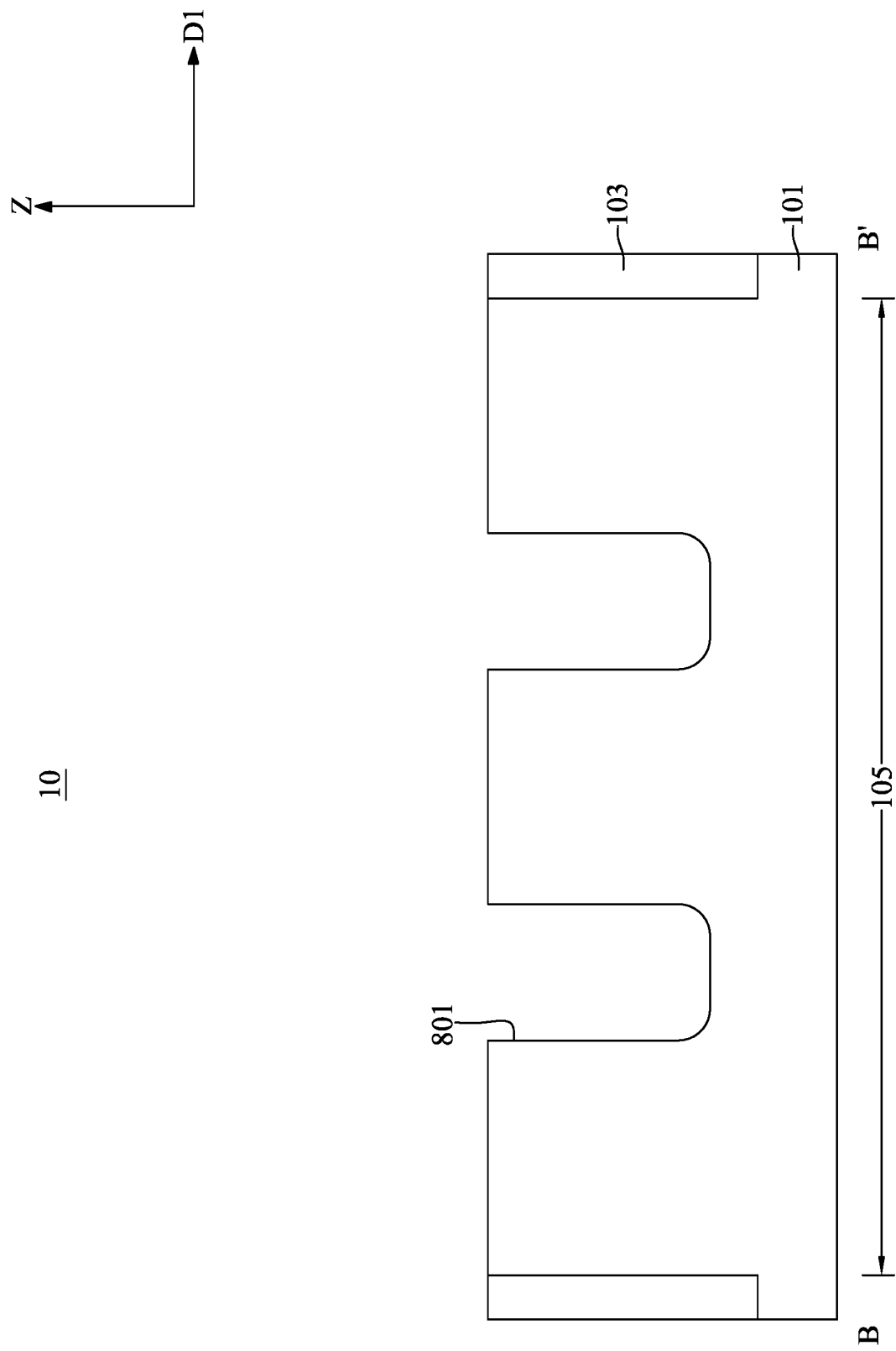
FIG. 7 is a schematic cross-sectional view diagram taken along the line B-B' in FIG. 6.
Figure 8:
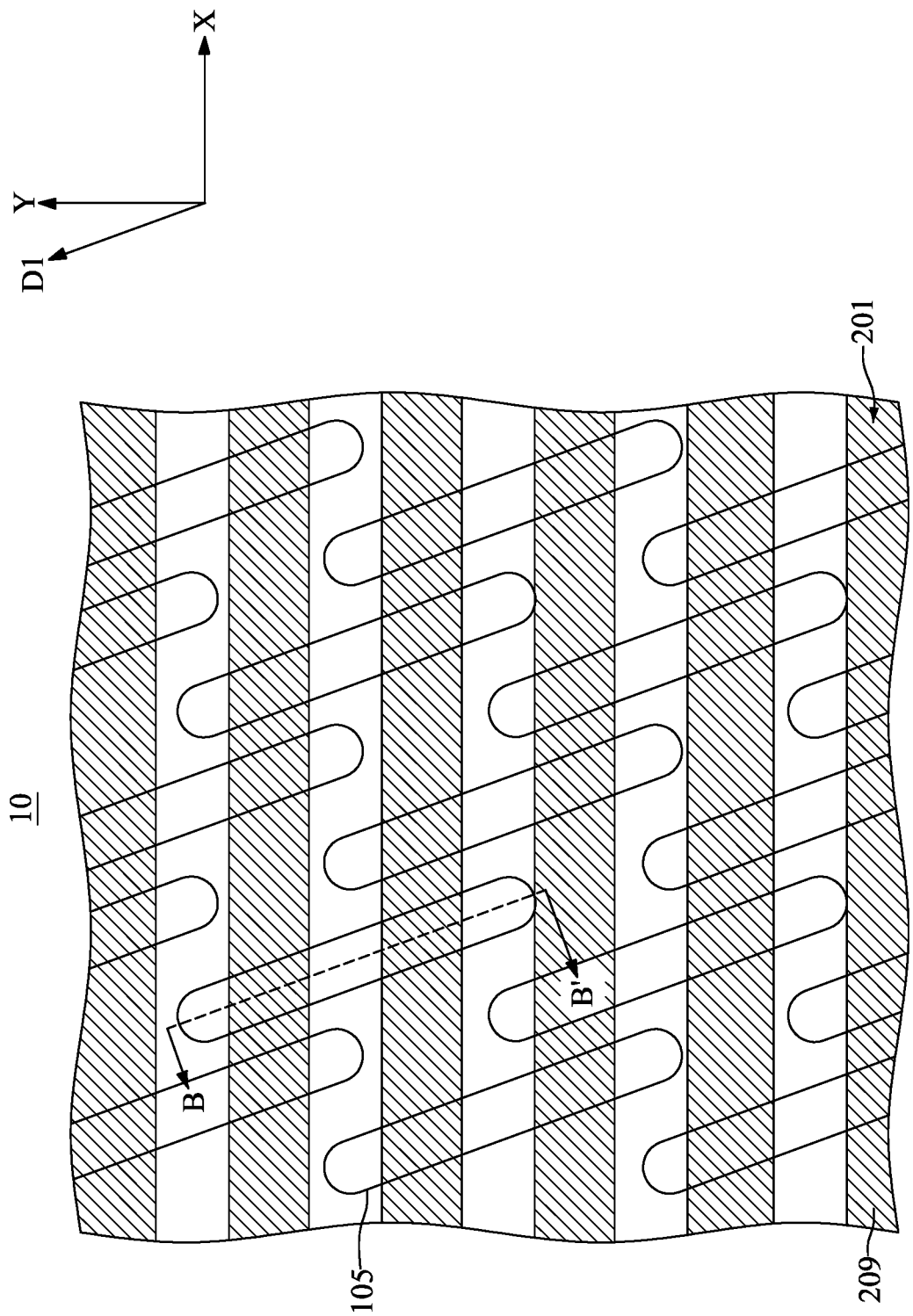
FIG. 8 illustrates, in a schematic close-up top-view diagram, an intermediate semiconductor device of the first testing area in accordance with one embodiment of the present disclosure.
Figure 9:
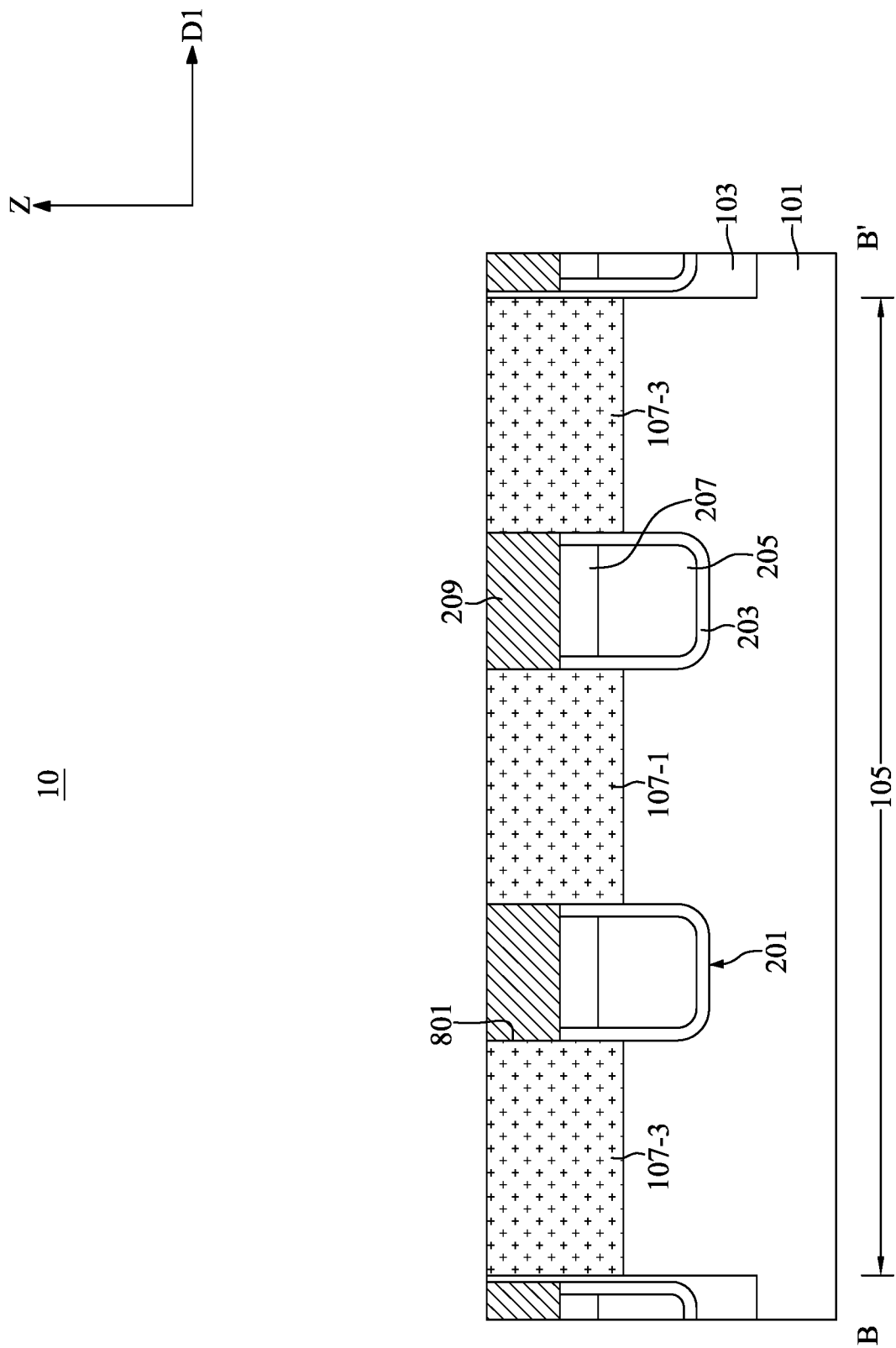
FIG. 9 is a schematic cross-sectional view diagram taken along the line B-B' in FIG. 8.

FIG. 6 illustrates, in a schematic close-up top-view diagram, an intermediate semiconductor device of the first testing area 10 in accordance with one embodiment of the present disclosure. FIG. 7 is a schematic cross-sectional view diagram taken along the line B-B' in FIG. 6 illustrating part of the flow for fabricating the semiconductor device 1A in accordance with one embodiment of the present disclosure. FIG. 8 illustrates, in a schematic close-up top-view diagram, an intermediate semiconductor device of the first testing area 10 in accordance with one embodiment of the present disclosure. FIG. 9 is a schematic cross-sectional view diagram taken along the line B-B' in FIG. 8 illustrating part of the flow for fabricating the semiconductor device 1A in accordance with one embodiment of the present disclosure.

With reference to FIG. 1 and FIGS. 6 to 9, at step S13, word line structures 201 may be formed in the substrate 101.

With reference to FIGS. 6 and 7, word line trenches 801 may be formed in the substrate 101. The formation of the word line trenches 801 may include forming a mask layer (e.g., a hard mask pattern) having openings and then using the mask layer as an etching mask to etch the exposed active areas 105 and the isolation layer 103. In a top-view perspective, the word line trenches 801 may extend along the first axis X and parallel to each other. The word line trenches 801 may be arranged along the second axis Y. Each of the active areas 105 may intersect with two of the word line trenches 801. The two of the word line trenches 801 may divide the corresponding active area 105 into three segments. It should be noted that, in the present disclosure, the term "segment" may be interchangeably used with the term "portion."

With reference to FIGS. 8 and 9, a word line dielectric layer 203, a word line bottom conductive layer 205, a word line top conductive layer 207, and a word line capping layer 209 may be formed in each of the word line trenches 801. For example, the word line dielectric layer 203 may be conformally formed in each of the word line trenches 801. The word line dielectric layer 203 may include, for example, one or more layers of silicon oxide, silicon nitride, silicon oxynitride, silicon nitride oxide, and a high-k dielectric material.

The word line bottom conductive layer 205 may be formed by filling each of the word line trenches 801 with a conductive material and a following recessing process which lower the top surface of the word line bottom conductive layer 205. The conductive material may be, for example, polycrystalline silicon, polycrystalline germanium, polycrystalline silicon germanium, the like, or a combination thereof. In some embodiments, the word line bottom conductive layers 205 may be doped with a dopant such as phosphorus, arsenic, antimony, or boron.

The word line top conductive layer 207 may be formed by filling each of the word line trenches 801 with a conductive material and a following recessing process which lower the top surface of the word line top conductive layer 207. The conductive material may be, for example, tungsten, aluminum, titanium, copper, titanium nitride, the like, or a combination thereof.

The word line capping layer 209 may be formed on the recessed word line top conductive layer 207. The word line capping layer 209 may have a top surface substantially coplanar with that of the substrate 101.

The word line dielectric layers 203, the word line bottom conductive layers 205, the word line top conductive layers 207, and the word line capping layers 209 together form the word line structures 201. In a top-view perspective, the word line structures 201 may extend along the first axis X and parallel to each other. The word line structures 201 may be arranged along the second axis Y. Each of the active areas 105 may intersect with two of the word line structures 201.

With reference to FIGS. 8 and 9, an ion implantation process may be performed on the active areas 105, so that source/drain regions 107-1, 107-3 may be formed in upper portions of the active areas 105. In a top-view perspective, for each of the active areas 105, the source region 107-1 may be formed between the two of the word line structures 201 intersected with the active area 105. The drain regions 107-3 may be formed at two ends of the active area 105. The source/drain regions 107-1, 107-3 may be doped with a dopant such as phosphorus, arsenic, antimony, or boron.

Figure 10:
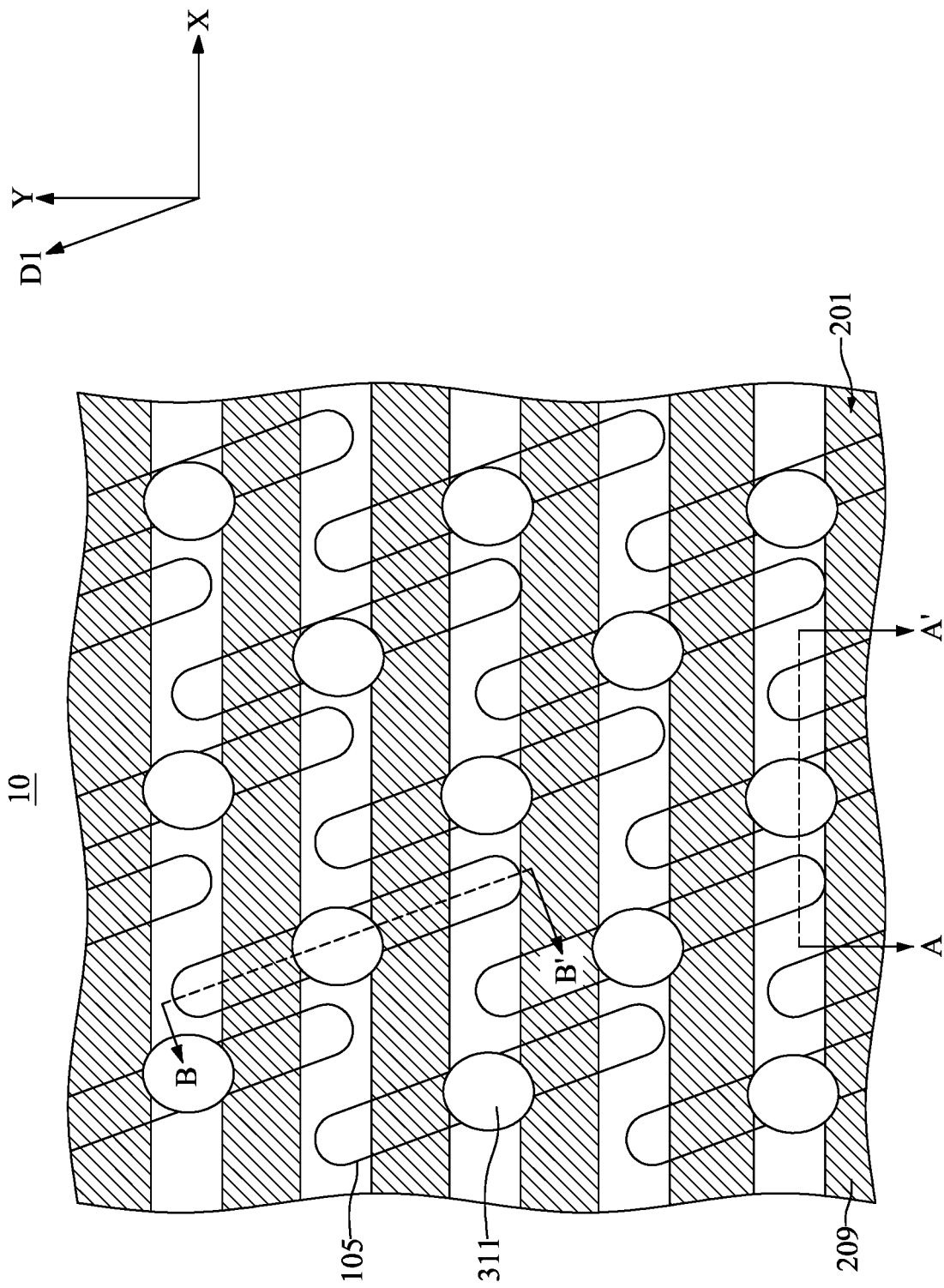
FIG. 10 illustrates, in a schematic close-up top-view diagram, an intermediate semiconductor device of the first testing area in accordance with one embodiment of the present disclosure.
Figure 11:
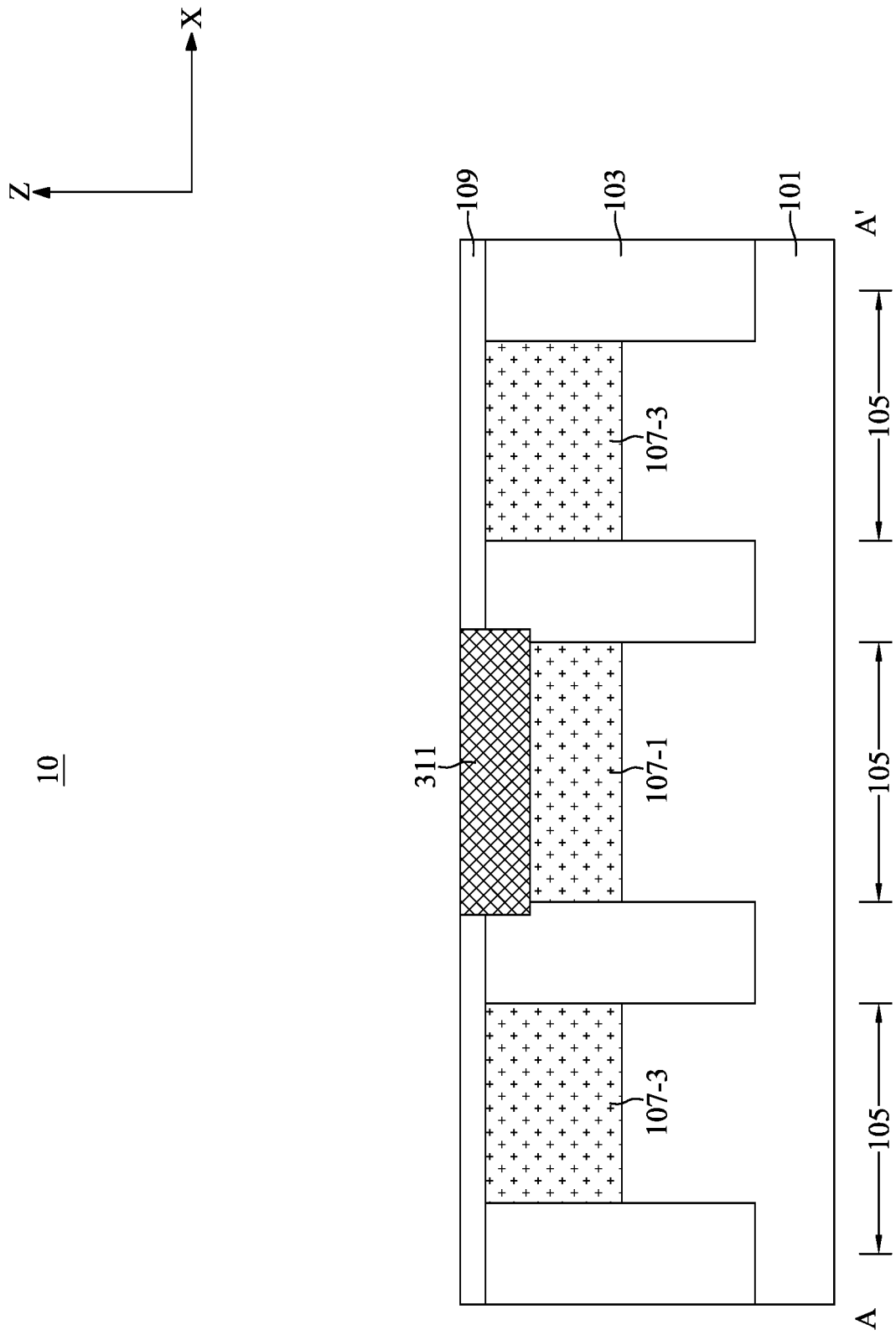
FIGS. 11 and 12 are schematic cross-sectional view diagrams respectively taken along the line A-A' and the line B-B' in FIG. 10.
Figure 12:
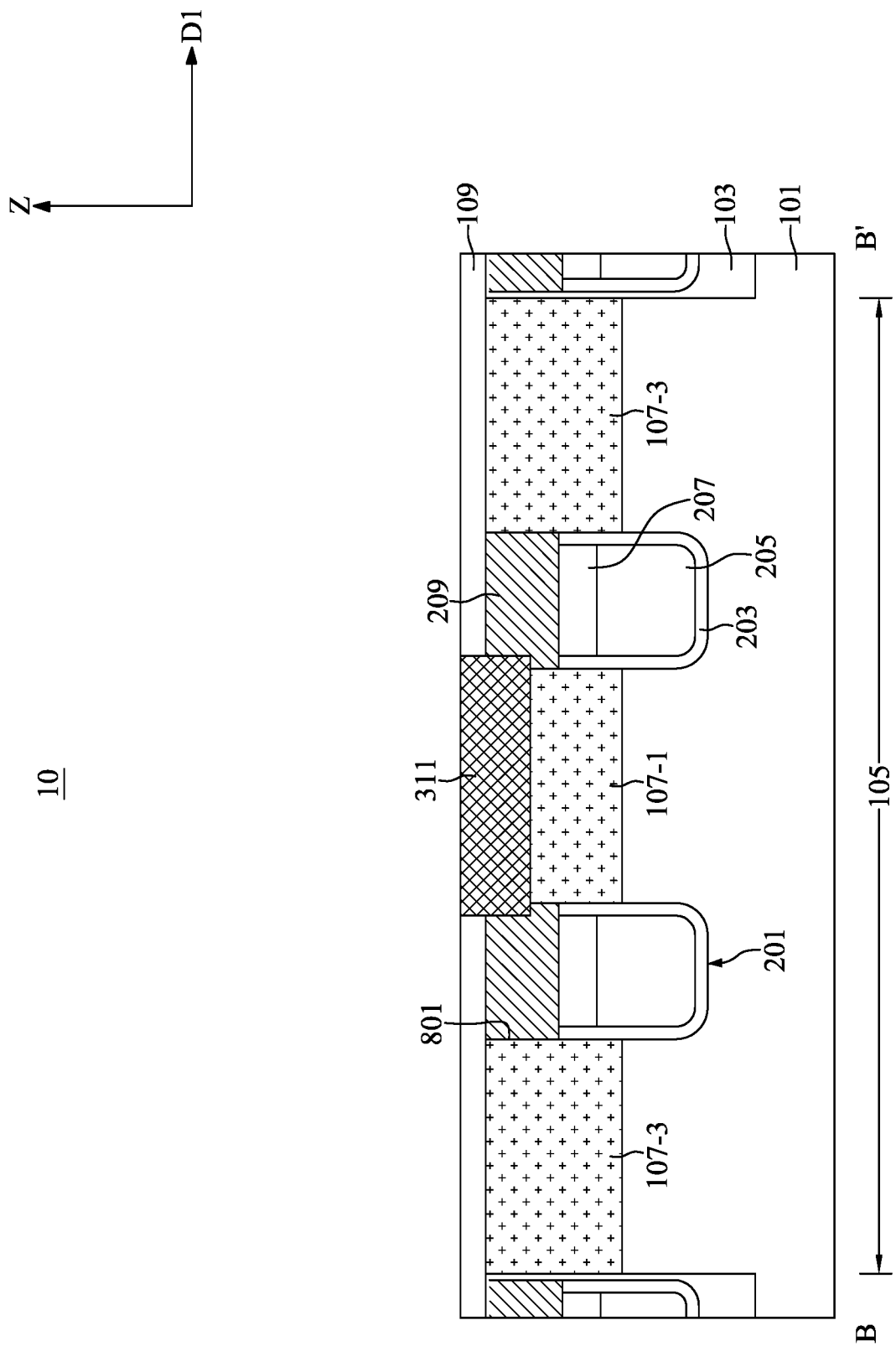
Figure 13:
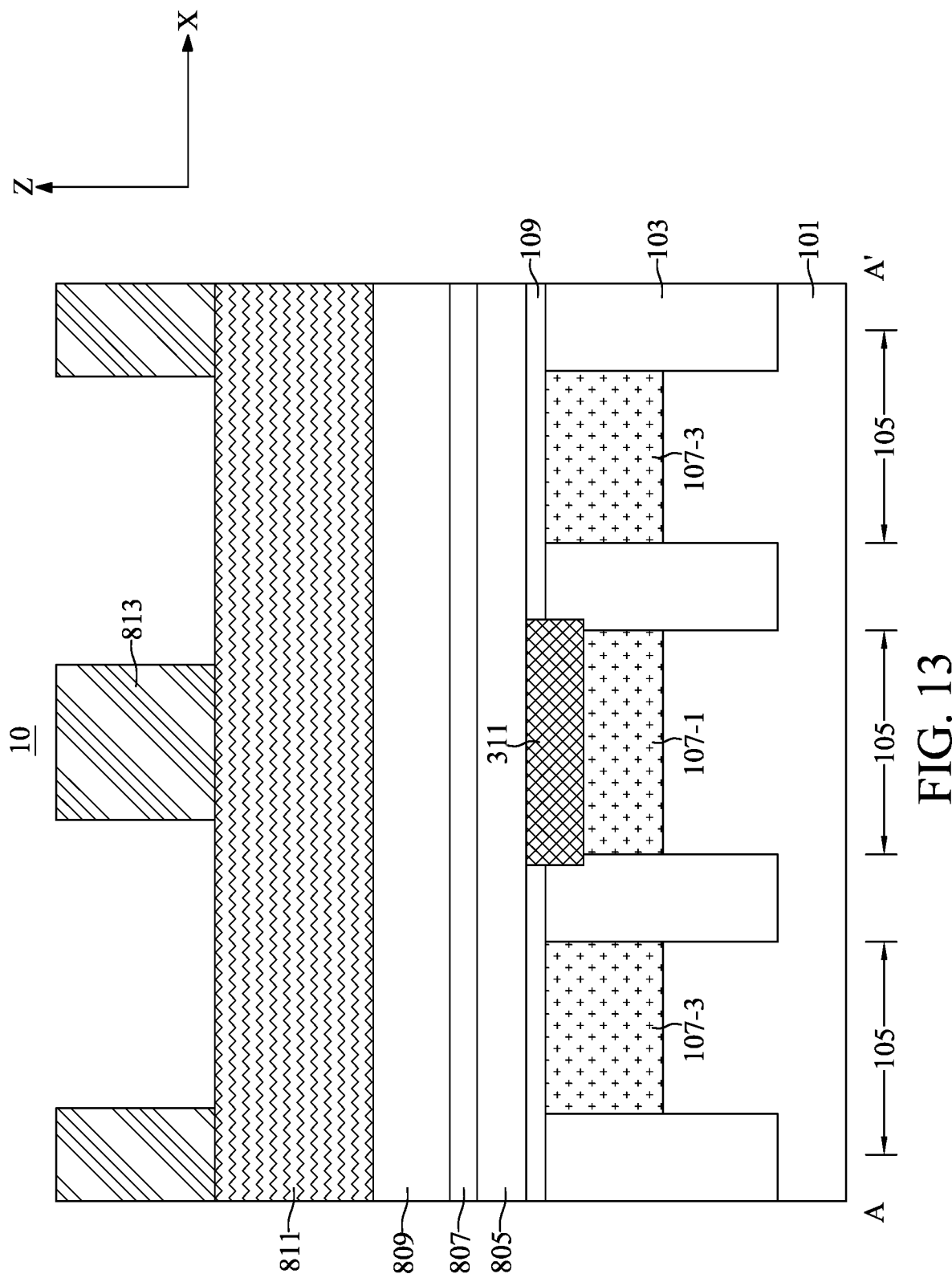
FIGS. 13 and 14 are schematic cross-sectional view diagrams respectively taken along the line A-A' and the line B-B' in FIG. 10.
Figure 14:
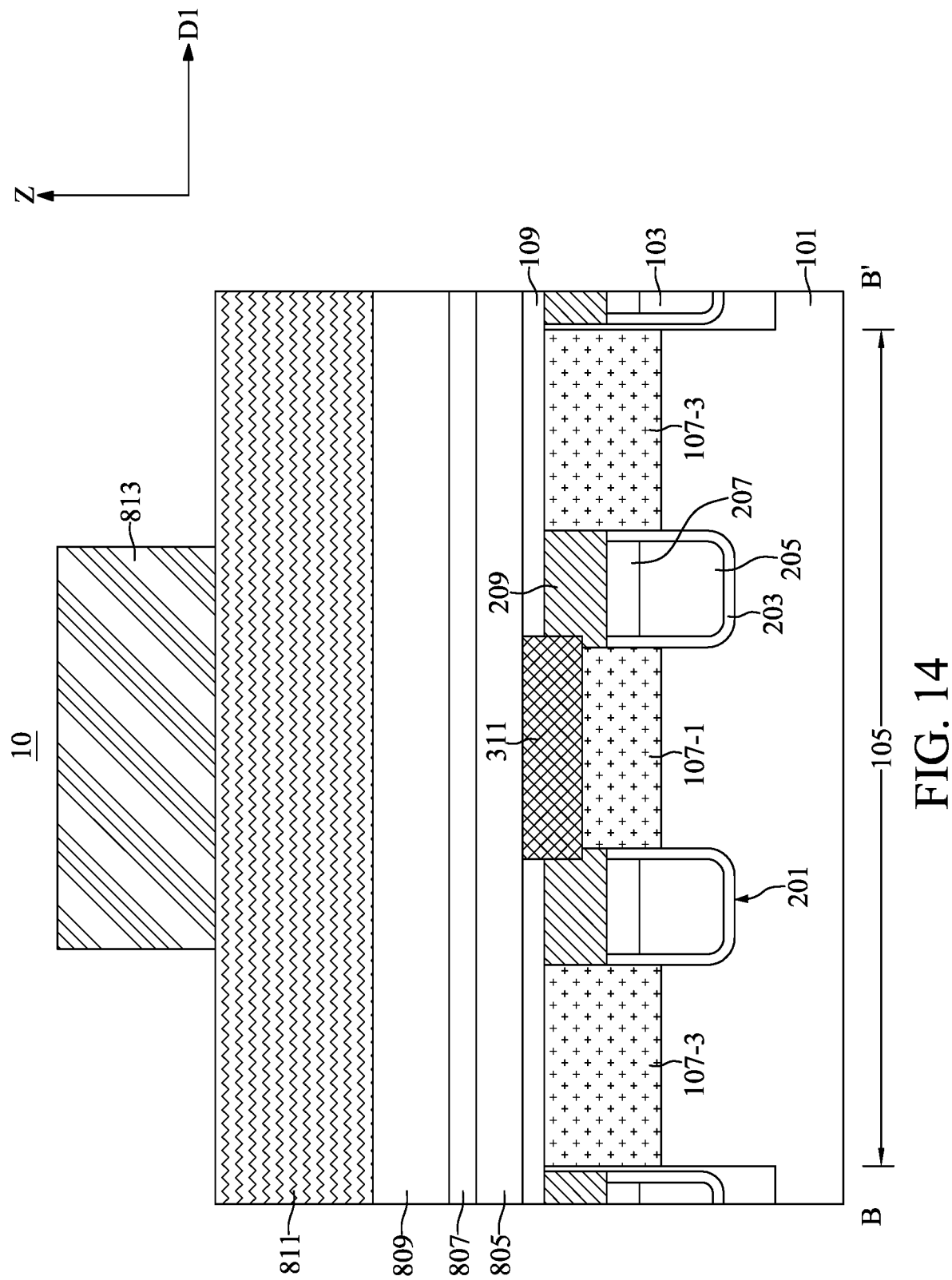

FIG. 10 illustrates, in a schematic close-up top-view diagram, an intermediate semiconductor device of the first testing area 10 in accordance with one embodiment of the present disclosure. FIGS. 11 and 12 are schematic cross-sectional view diagrams respectively taken along the line A-A' and the line B-B' in FIG. 10 illustrating part of the flow for fabricating the semiconductor device 1A in accordance with one embodiment of the present disclosure. FIGS. 13 and 14 are schematic cross-sectional view diagrams respectively taken along the line A-A' and the line B-B' in FIG. 10 illustrating part of the flow for fabricating the semiconductor device 1A in accordance with one embodiment of the present disclosure.

Figure 15:
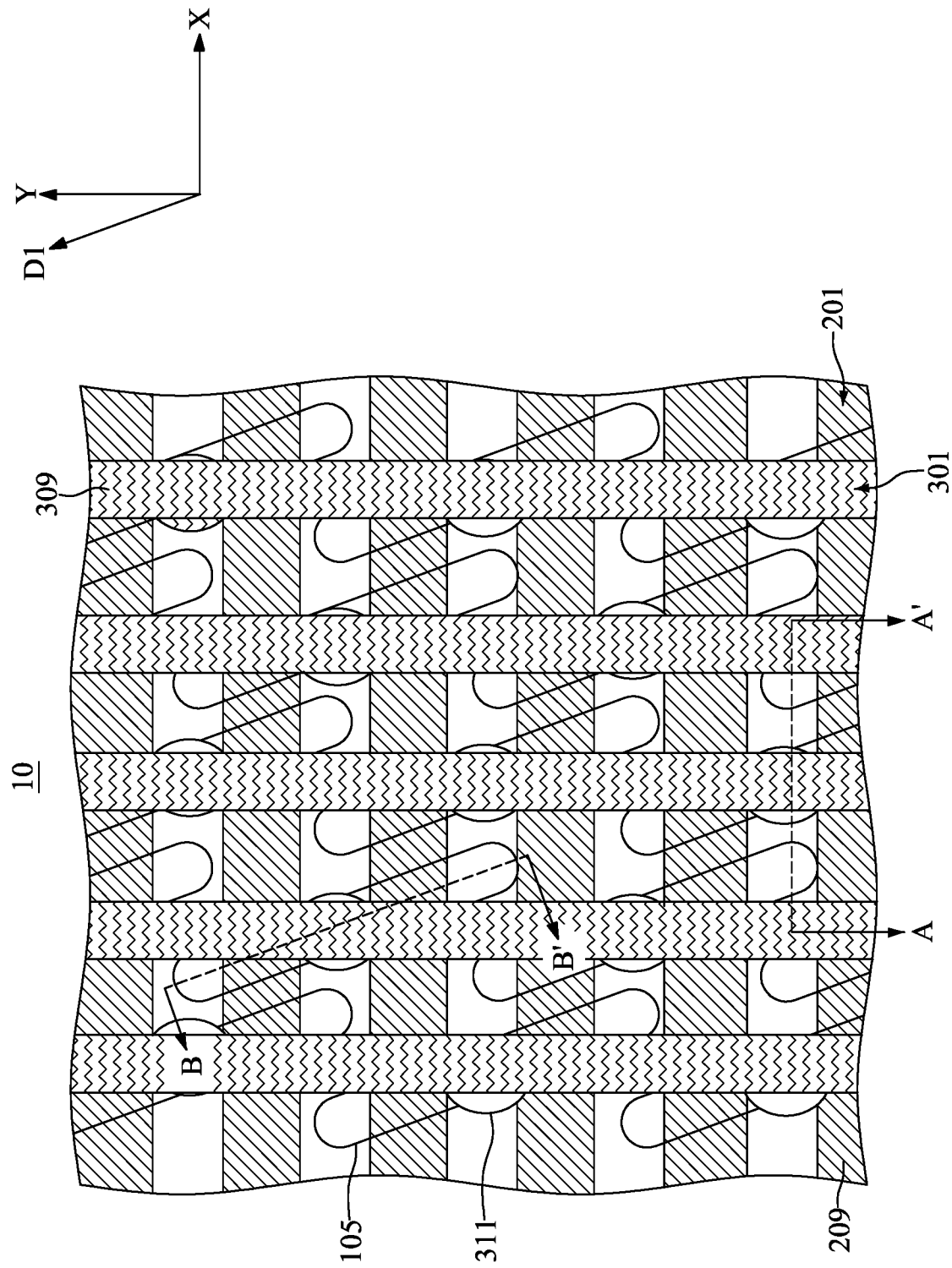
FIG. 15 illustrates, in a schematic close-up top-view diagram, an intermediate semiconductor device of the first testing area in accordance with one embodiment of the present disclosure.
Figure 16:
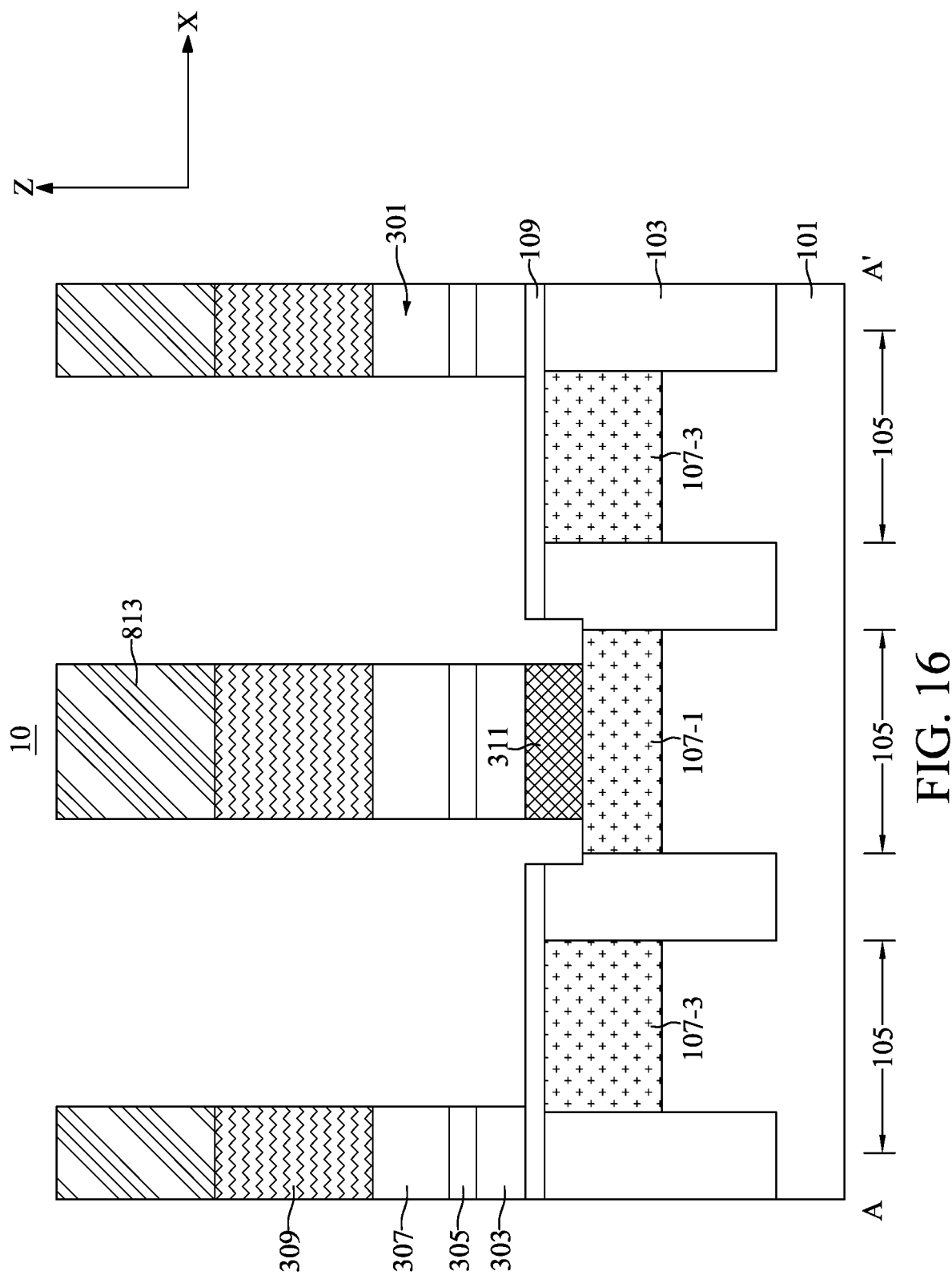
FIGS. 16 and 17 are schematic cross-sectional view diagrams respectively taken along the line A-A' and the line B-B' in FIG. 15.
Figure 17:
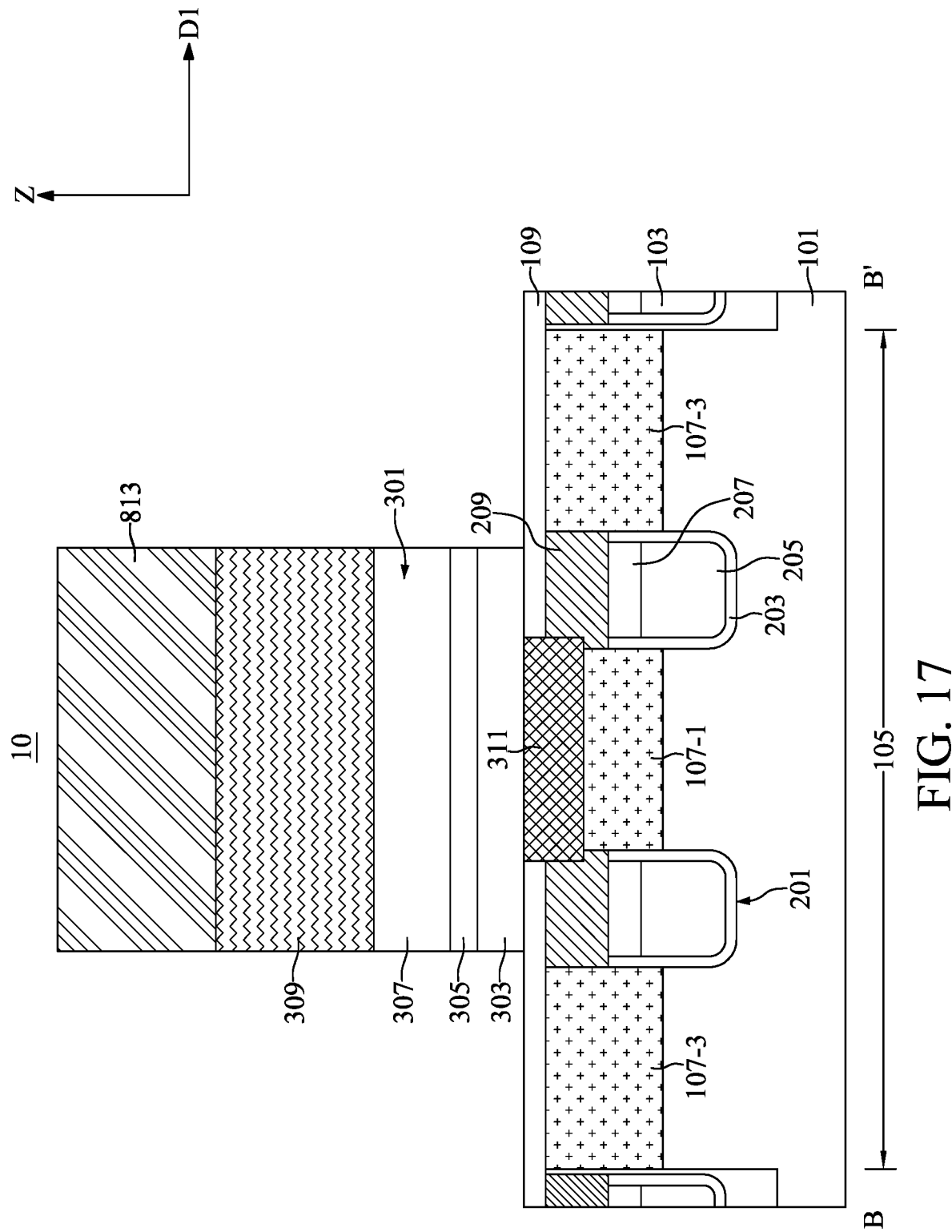

FIG. 15 illustrates, in a schematic close-up top-view diagram, an intermediate semiconductor device of the first testing area 10 in accordance with one embodiment of the present disclosure. FIGS. 16 and 17 are schematic cross-sectional view diagrams respectively taken along the line A-A' and the line B-B' in FIG. 15 illustrating part of the flow for fabricating the semiconductor device 1A in accordance with one embodiment of the present disclosure.

With reference to FIG. 1 and FIGS. 10 to 17, at step S15, an etching stop layer 109 may be formed on the substrate 101, bit line contacts 311 may be formed along the etching stop layer 109 and extended to the substrate 101, and bit line structures 301 may be formed on the etching stop layer 109.

With reference to FIG. 10 to 12, the etching stop layer 109 may be formed on the substrate 101 (e.g., an entire surface of the substrate 101). The etching stop layer 109 may be formed of, for example, silicon oxide, silicon nitride, silicon oxynitride, silicon nitride oxide, silicon carbon nitride, the like, or a combination thereof. Subsequently, the etching stop layer 109 may be patterned (e.g., etched) to form openings exposing the source regions 107-1. A conductive material may be deposited to fill the openings. The conductive material may be, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. A planarization process, such as chemical mechanical polishing, may be performed until the top surface of the etching stop layer 109 is exposed to remove excess material, provide a substantially flat surface for subsequent processing steps, and concurrently form the bit line contacts 311.

With reference to FIGS. 13 and 14, a layer of first conductive material 805, a layer of second conductive material 807, a layer of third conductive material 809, a layer of first insulating material 811, and a first mask layer 813 may be sequentially formed on the etching stop layer 109.

The first conductive material 805 may be, for example, polycrystalline silicon, polycrystalline germanium, polycrystalline silicon germanium, titanium, tantalum, tungsten, copper, aluminum, tungsten silicide, cobalt silicide, or titanium silicide. The second conductive material 807 may be, for example, titanium nitride or tantalum nitride. The third conductive material 809 may be, for example, tungsten, tantalum, titanium, copper, or aluminum. The layer of second conductive material 807 may reduce or possibly prevent the conductive material in the layer of third conductive material 809 from diffusing toward the layer of first conductive material 805. The first insulating material 811 may be, for example, silicon nitride, silicon nitride oxide, silicon oxynitride, boron nitride, silicon boron nitride, phosphorus boron nitride, or boron carbon silicon nitride. The first mask layer 813 may have a pattern of the bit line structures 301.

With reference to FIGS. 15 to 17, an etch process, such as an anisotropic dry etch process, may be performed to transfer the pattern of the bit line structures 301 to layers underlying the first mask layer 813. After the etch process, the layer of first conductive material 805, the layer of second conductive material 807, the layer of third conductive material 809, and the layer of first insulating material 811 may be turned into bit line bottom conductive layers 303, bit line middle conductive layers 305, bit line top conductive layers 307, and bit line capping layers 309, respectively. The aforementioned layers together form the bit line structures 301. The first mask layer 813 may be removed after the formation of the bit line structures 301. In some embodiments, as shown in FIG. 16, portions of the bit line contacts 311 may be removed during the etch process for forming the bit line structures 301.

Figure 18:
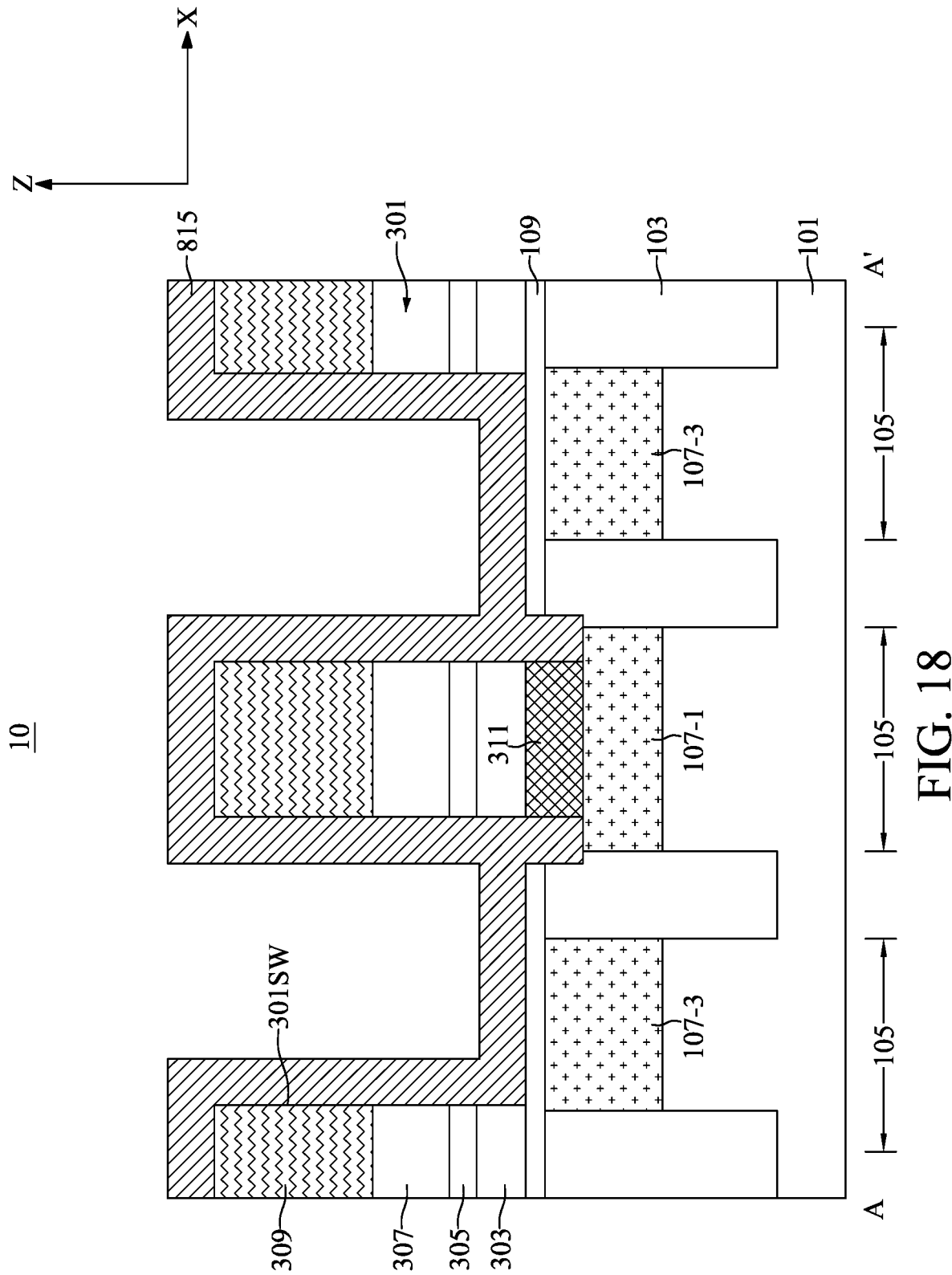
FIGS. 18 and 19 are schematic cross-sectional view diagrams respectively taken along the line A-A' and the line B-B' in FIG. 15.
Figure 19:
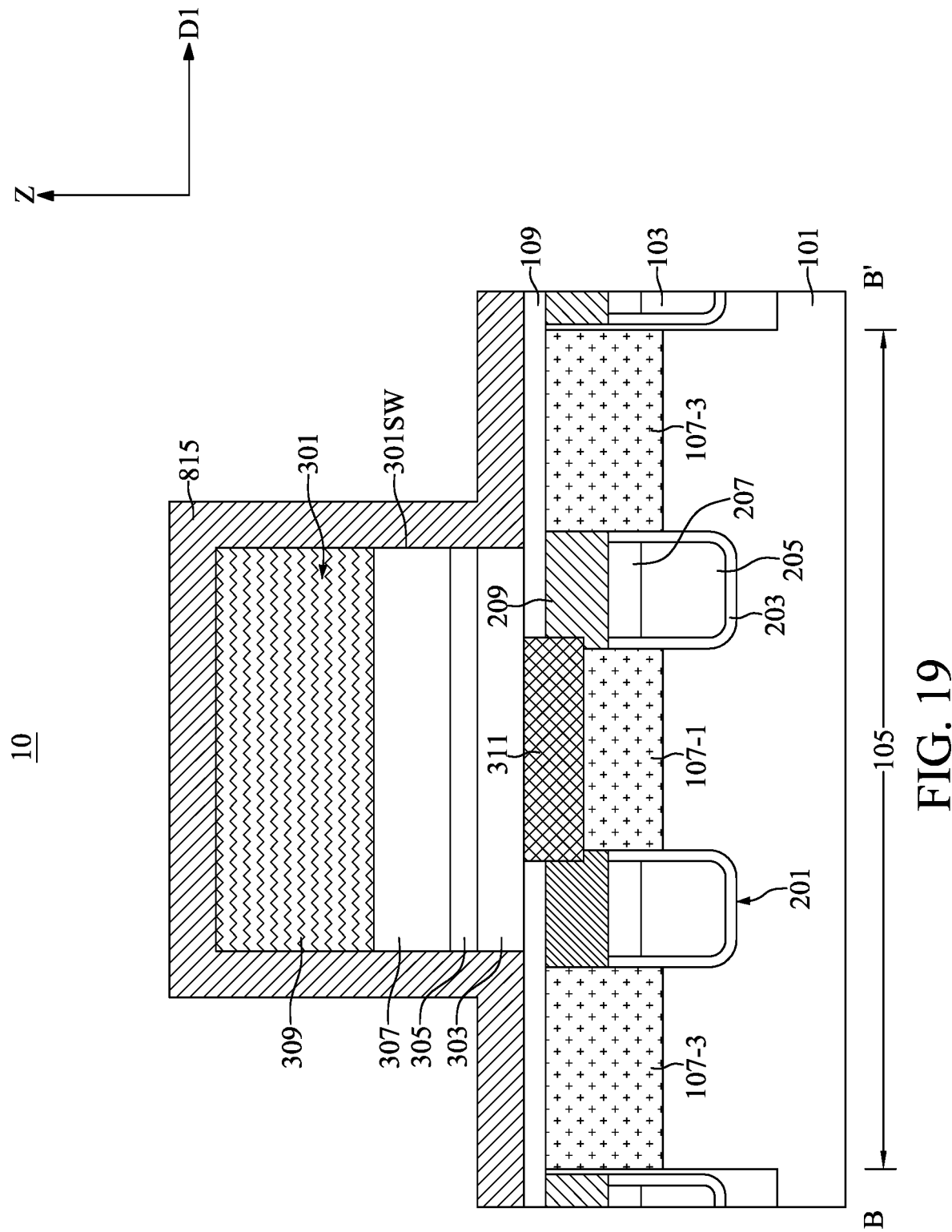
Figure 20:
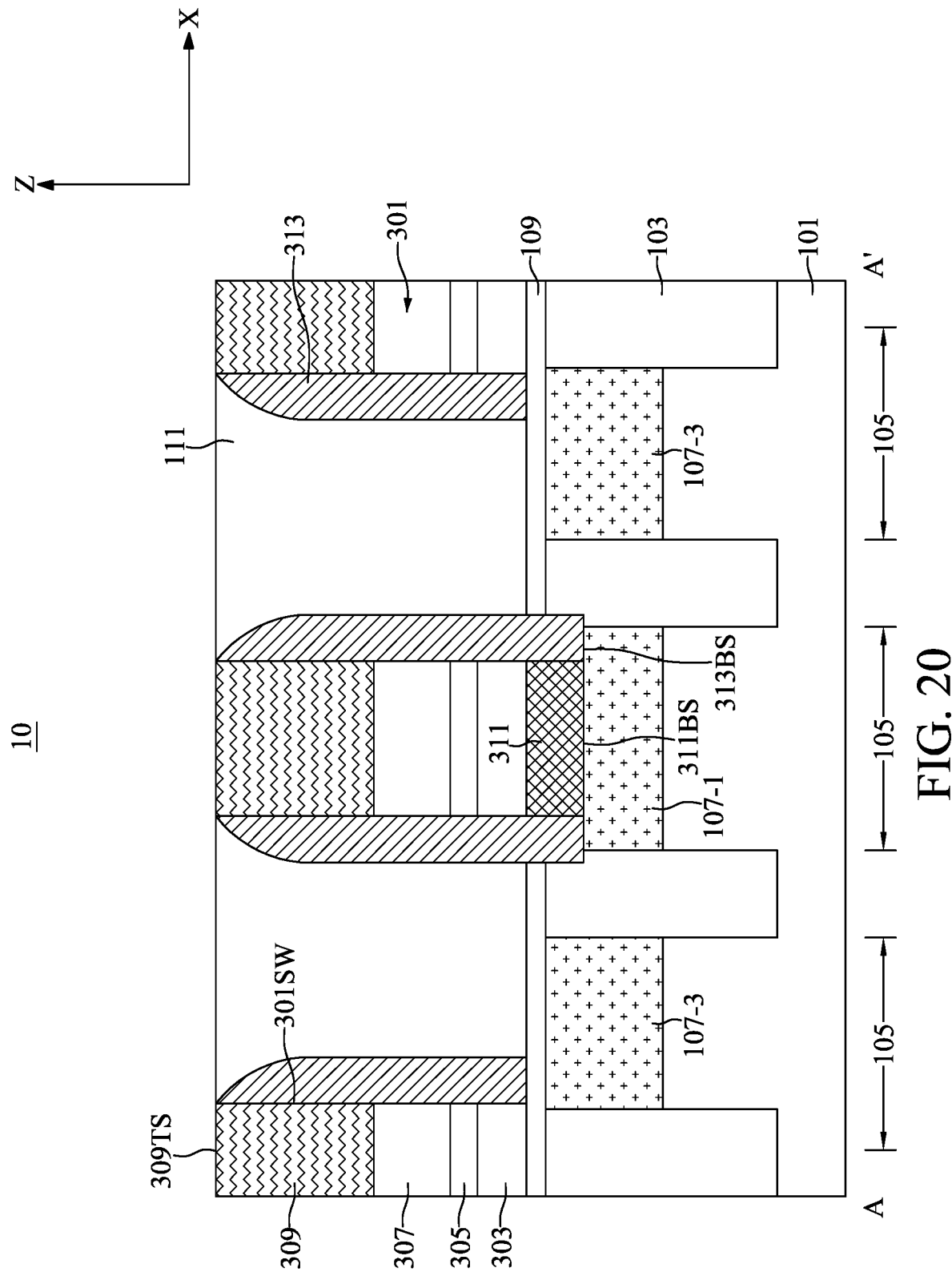
FIGS. 20 and 21 are schematic cross-sectional view diagrams respectively taken along the line A-A' and the line B-B' in FIG. 15.
Figure 21:
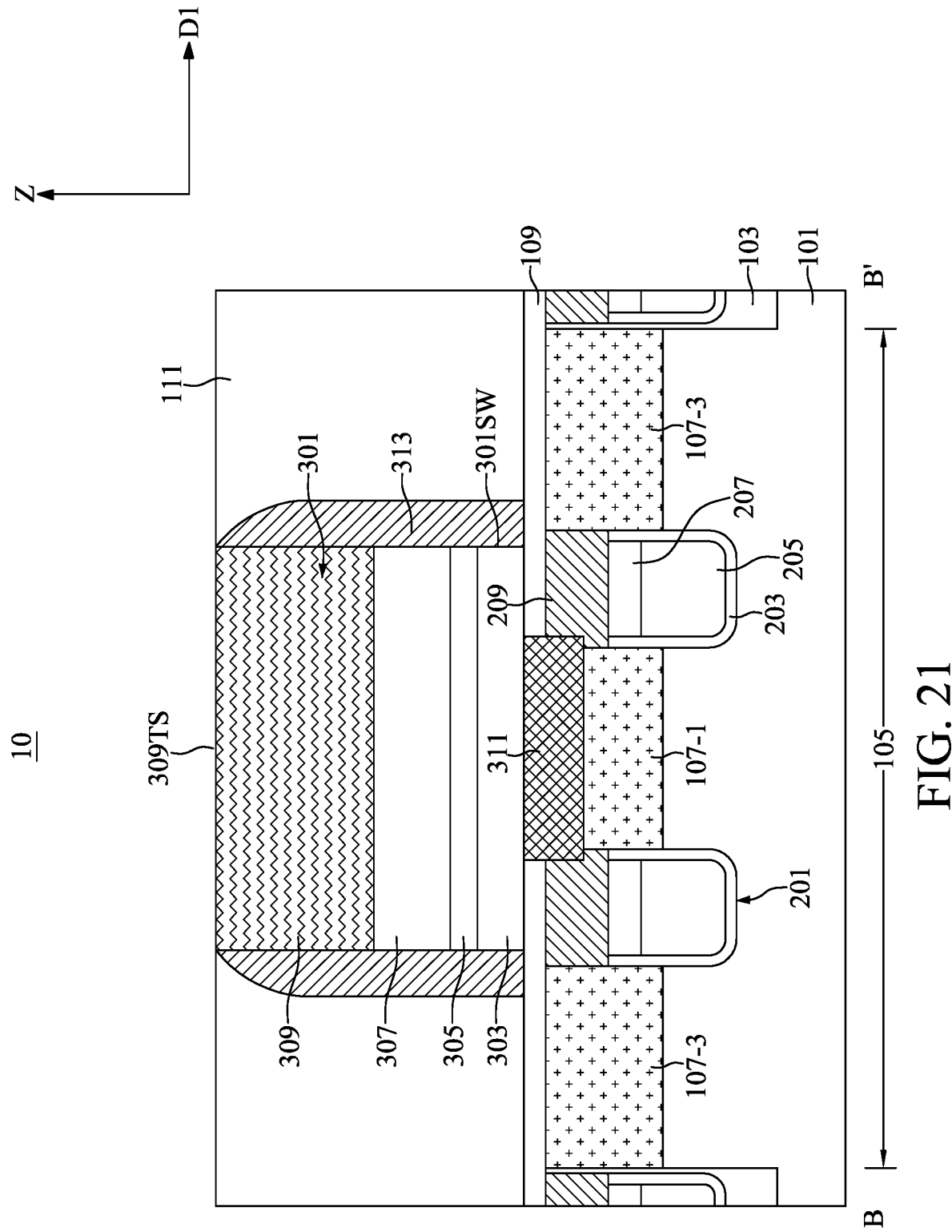

FIGS. 18 and 19 are schematic cross-sectional view diagrams respectively taken along the line A-A' and the line B-B' in FIG. 15 illustrating part of a flow for fabricating the semiconductor device 1A in accordance with one embodiment of the present disclosure. FIGS. 20 and 21 are schematic cross-sectional view diagrams respectively taken along the line A-A' and the line B-B' in FIG. 15 illustrating part of the flow for fabricating the semiconductor device 1A in accordance with one embodiment of the present disclosure.

With reference to FIG. 1 and FIGS. 18 to 21, at step S17, bit line spacers 313 may be formed on sidewalls 301SW of the bit line structures 301.

With reference to FIGS. 18 and 19, a layer of spacer material 815 may be conformally formed over the intermediate semiconductor device illustrated in FIGS. 16 and 17. The spacer material 815 may be, for example, silicon oxide, silicon nitride, silicon carbon nitride, silicon nitride oxide, or silicon oxynitride.

With reference to FIGS. 20 and 21, an etch process, such as an anisotropic dry etch process, may be performed to remove portions of the layer of spacer material 815 and concurrently form the bit line spacers 313 attached on sidewalls 301SW of the bit line structures 301. In some embodiments, some portions of the bottom surface 313BS of the bit line spacers 313 may be substantially coplanar with the bottom surfaces 311BS of the bit line contacts 311 as shown in FIG. 20.

With reference to FIGS. 20 and 21, a layer of insulating material may be deposited to cover the etching stop layer 109, the bit line structures 301, and the bit line spacers 313. The insulating material may be, for example, silicon oxide, undoped silicate glass, fluorosilicate glass, borophosphosilicate glass, a low-k dielectric material, or a combination thereof. The low-k dielectric materials may have a dielectric constant less than 3.0 or even less than 2.5. In some embodiments, the low-k dielectric materials may have a dielectric constant less than 2.0. A planarization process, such as chemical mechanical polishing, may be performed until the top surfaces 309TS of the bit line capping layers 309 are exposed to remove excess material, provide a substantially flat surface for subsequent processing steps, and concurrently turn the layer of insulating material into a first insulating layer 111.

Figure 22:
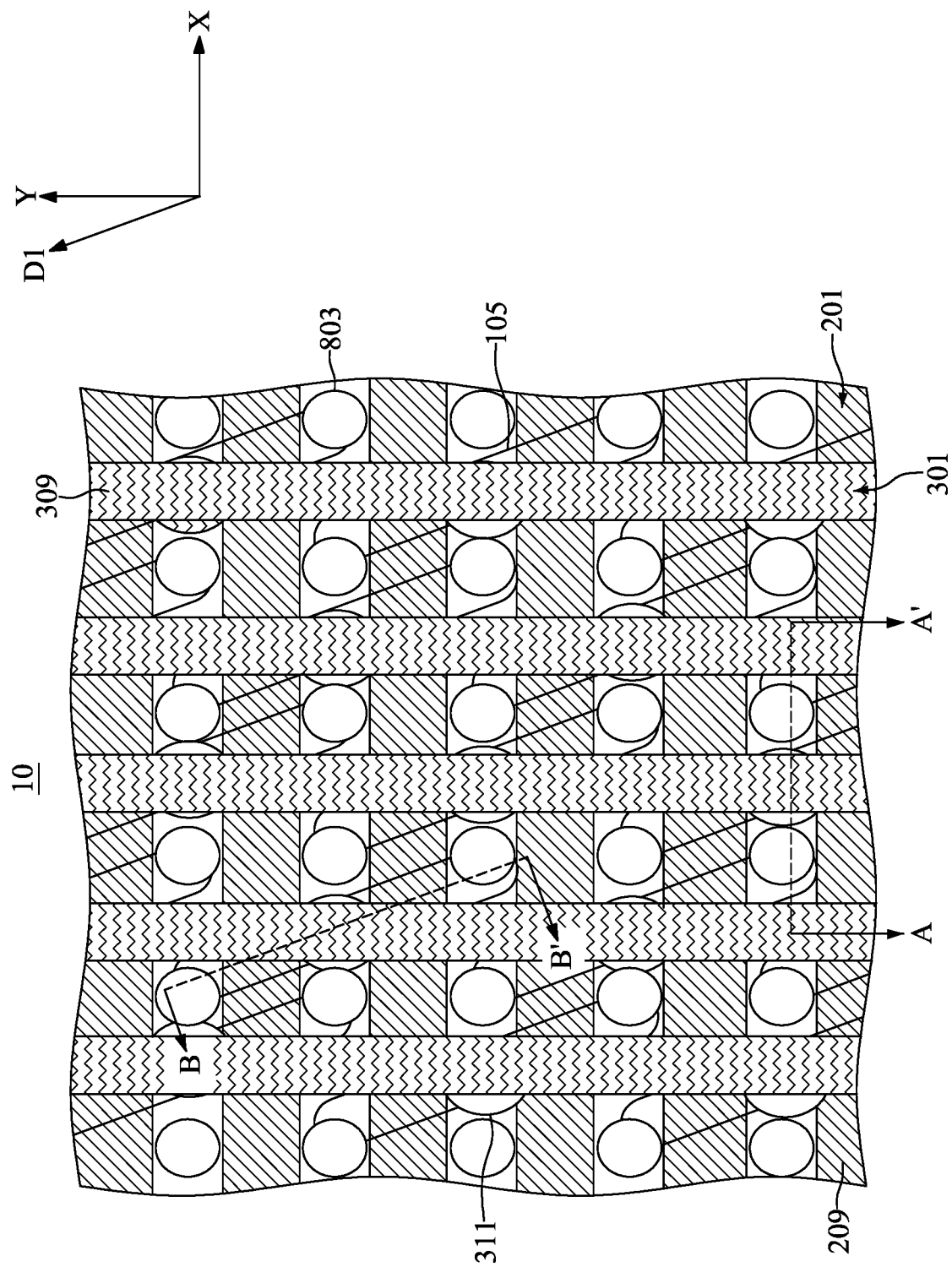
FIG. 22 illustrates, in a schematic close-up top-view diagram, an intermediate semiconductor device of the first testing area in accordance with one embodiment of the present disclosure.
Figure 23:
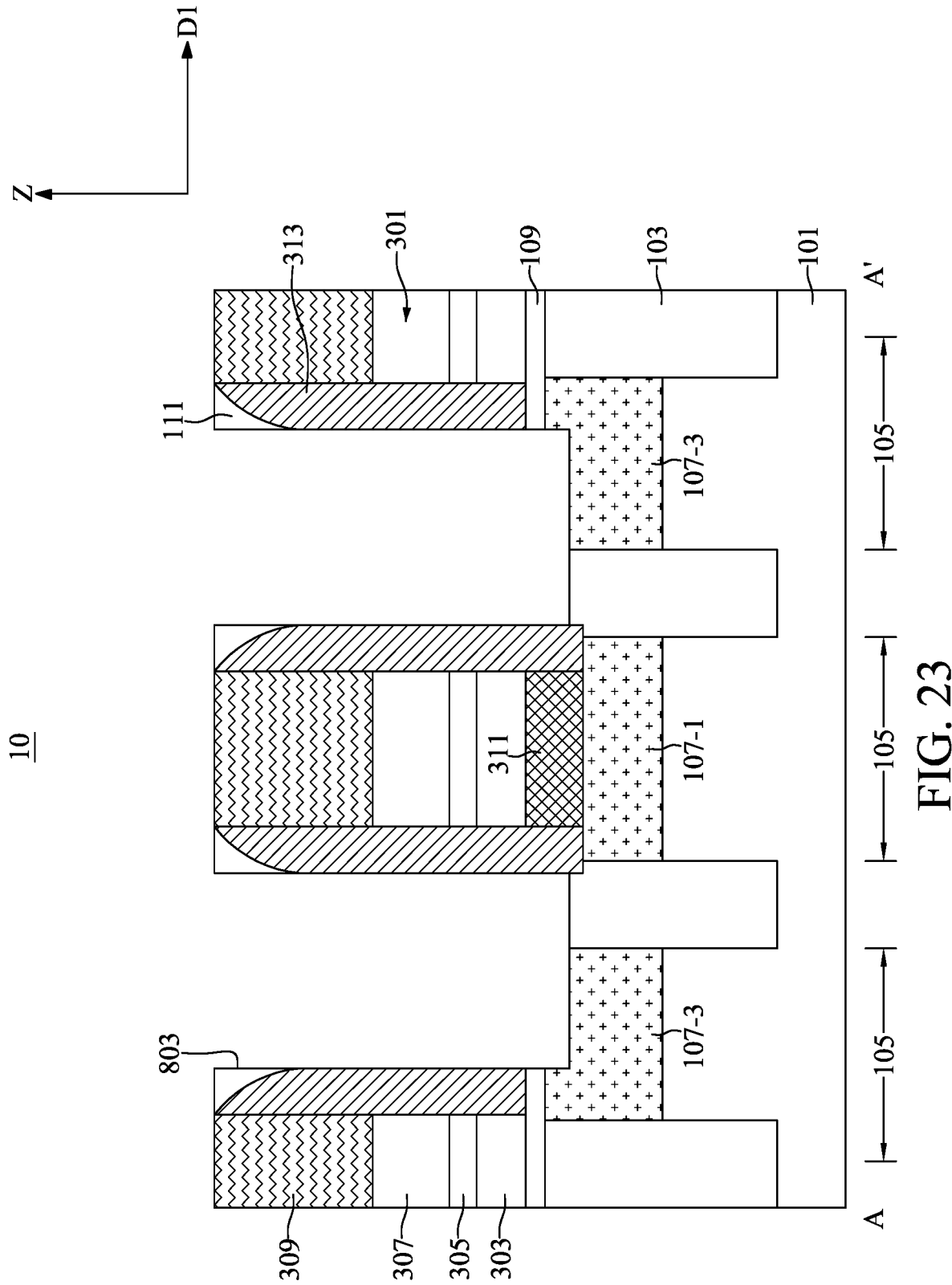
FIGS. 23 and 24 are schematic cross-sectional view diagrams respectively taken along the line A-A' and the line B-B' in FIG. 22.
Figure 24:
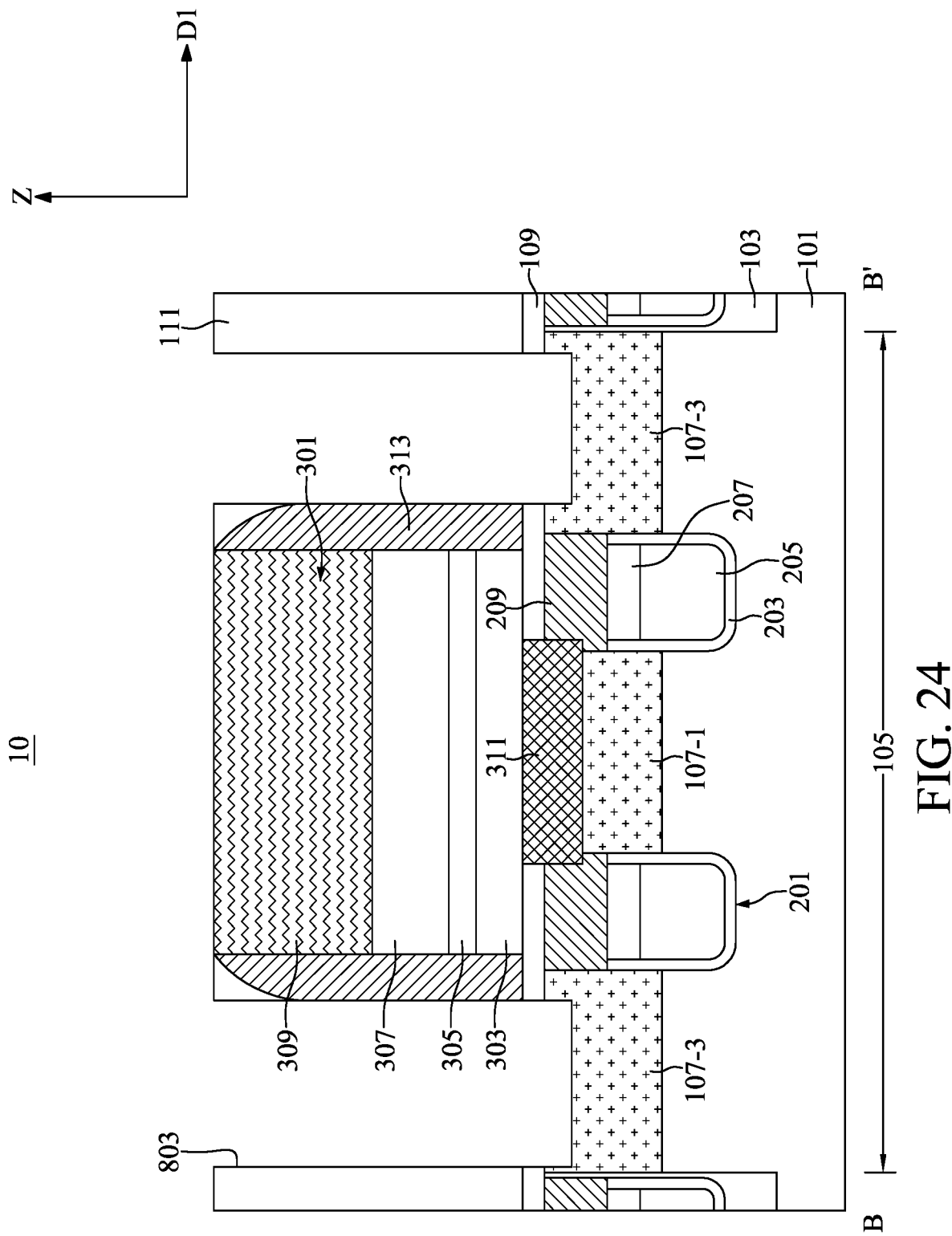

FIG. 22 illustrates, in a schematic close-up top-view diagram, an intermediate semiconductor device of the first testing area 10 in accordance with one embodiment of the present disclosure. FIGS. 23 and 24 are schematic cross-sectional view diagrams respectively taken along the line A-A' and the line B-B' in FIG. 22 illustrating part of the flow for fabricating the semiconductor device 1A in accordance with one embodiment of the present disclosure.

With reference to FIG. 1 and FIGS. 22 to 24, at step S19, contact openings 803 may be formed extended to the substrate 101 and adjacent to the bit line structures 301.

With reference to FIGS. 22 to 24, a photolithography process and a following etch process may be performed to form the contact openings 803 along the first insulating layer 111 and extended to the upper portion of the substrate 101. Portions of the drain regions 107-3 may be exposed through the contact openings 803. In a top-view perspective, the contact openings 803 may be located on the ends of the active areas 105.

Figure 25:
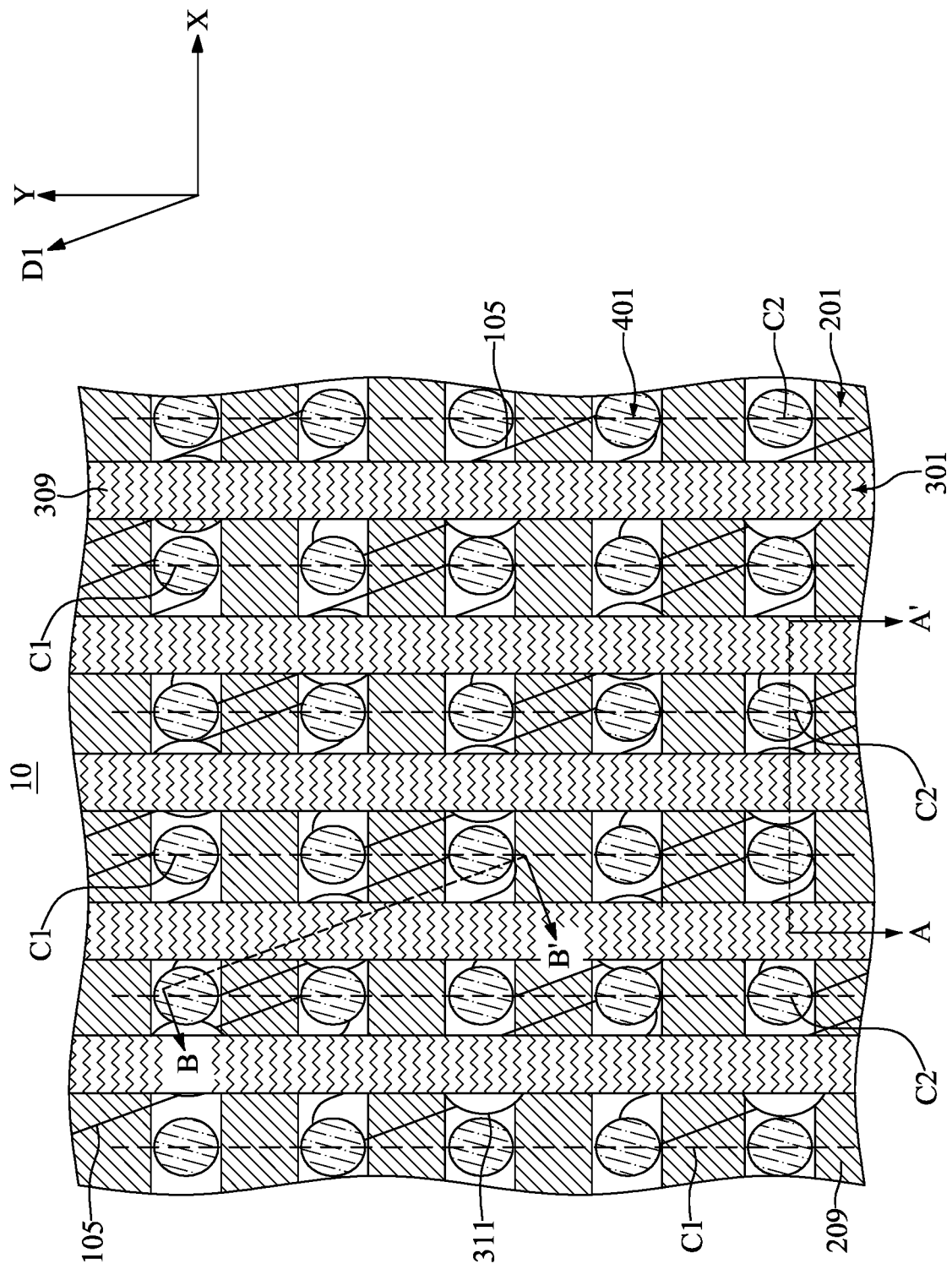
FIG. 25 illustrates, in a schematic close-up top-view diagram, an intermediate semiconductor device of the first testing area in accordance with one embodiment of the present disclosure.
Figure 26:
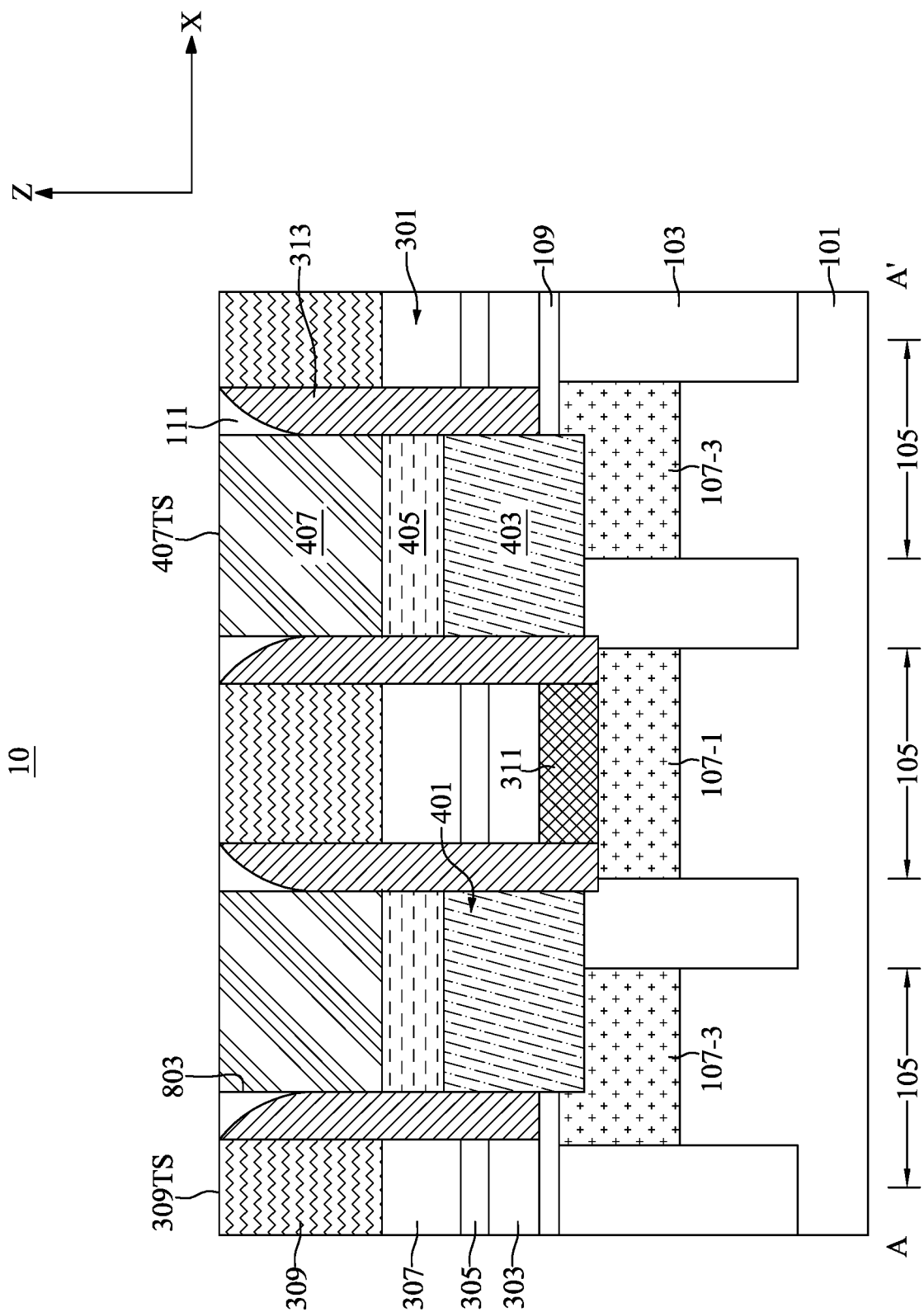
FIGS. 26 and 27 are schematic cross-sectional view diagrams respectively taken along the line A-A' and the line B-B' in FIG. 25.
Figure 27:
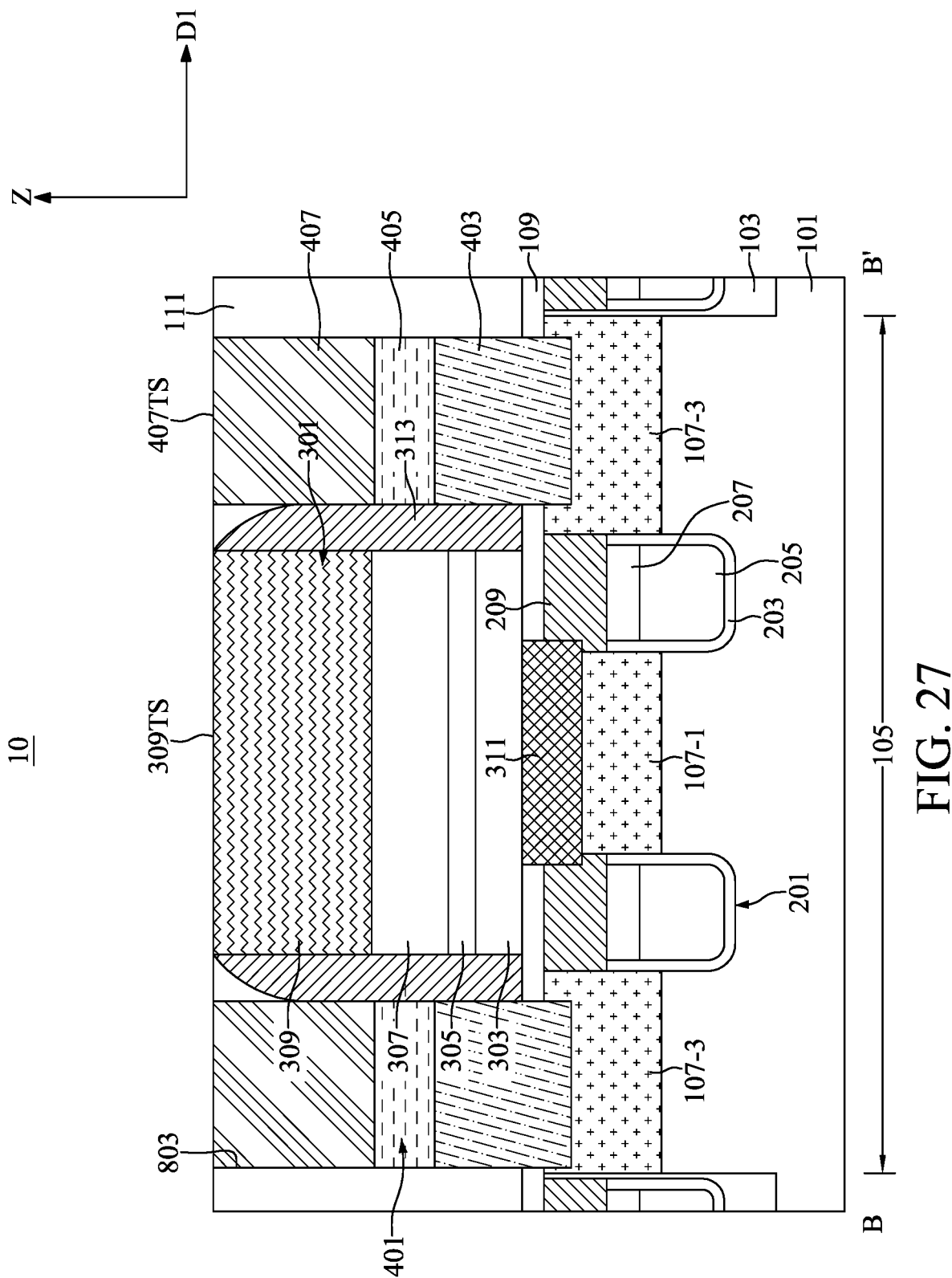

FIG. 25 illustrates, in a schematic close-up top-view diagram, an intermediate semiconductor device of the first testing area 10 in accordance with one embodiment of the present disclosure. FIGS. 26 and 27 are schematic cross-sectional view diagrams respectively taken along the line A-A' and the line B-B' in FIG. 25 illustrating part of the flow for fabricating the semiconductor device 1A in accordance with one embodiment of the present disclosure.

With reference to FIG. 1 and FIGS. 25 to 27, at step S21, capacitor contact structures 401 may be formed in the contact openings 803.

With reference to FIGS. 25 to 27, contact bottom conductive layers 403 may be respectively correspondingly formed in the contact openings 803. The contact bottom conductive layers 403 may be formed of, for example, polycrystalline silicon, polycrystalline germanium, or polycrystalline silicon germanium. In some embodiments, the contact bottom conductive layers 403 may be doped with a dopant such as phosphorus, arsenic, antimony, or boron.

With reference to FIGS. 25 to 27, contact middle conductive layers 405 may be respectively correspondingly formed on the contact bottom conductive layers 403 and in the capacitor contact openings 703. The contact middle conductive layers 405 may be formed of, for example, cobalt silicide, titanium silicide, nickel silicide, nickel platinum silicide, or tantalum silicide. The top surfaces of the contact middle conductive layers 405 may be at a vertical level lower than a vertical level of the top surfaces 309TS of the bit line capping layers 309. The contact middle conductive layers 405 may reduce the contact resistance between the contact bottom conductive layers 403 and the contact top conductive layers 407 as will be illustrated later.

With reference to FIGS. 25 to 27, contact top conductive layers 407 may be respectively correspondingly formed on the contact middle conductive layers 405 and may completely fill the contact openings 803. The top surfaces 407TS of the contact top conductive layers 407 may be substantially coplanar with the top surfaces 309TS of the bit line capping layers 309. The contact top conductive layers 407 may be formed of, for example, titanium nitride or tantalum nitride.

The contact bottom conductive layers 403, the contact middle conductive layers 405, and the contact top conductive layers 407 together form the capacitor contact structures 401.

In a top-view perspective, the capacitor contact structures 401 may be arranged in a grid dot pattern. The capacitor contact structures 401 in the first testing area 10 may be categorized into two groups, for example, first columns C1 of capacitor contact structures 401 and second columns C2 of capacitor contact structures 401. Each column of the first columns C1 of capacitor contact structures 401 may include multiple capacitor contact structures 401 that arranged along the second axis Y. The first columns C1 of capacitor contact structures 401 may parallel to each other. Each column of the second columns C2 of capacitor contact structures 401 may include multiple capacitor contact structures 401 that arranged along the second axis Y. The second columns C2 of capacitor contact structures 401 may parallel to each other. The first columns C1 of capacitor contact structures 401 and the second columns C2 of capacitor contact structures 401 may be alternatively arranged along the first axis X.

Figure 28:
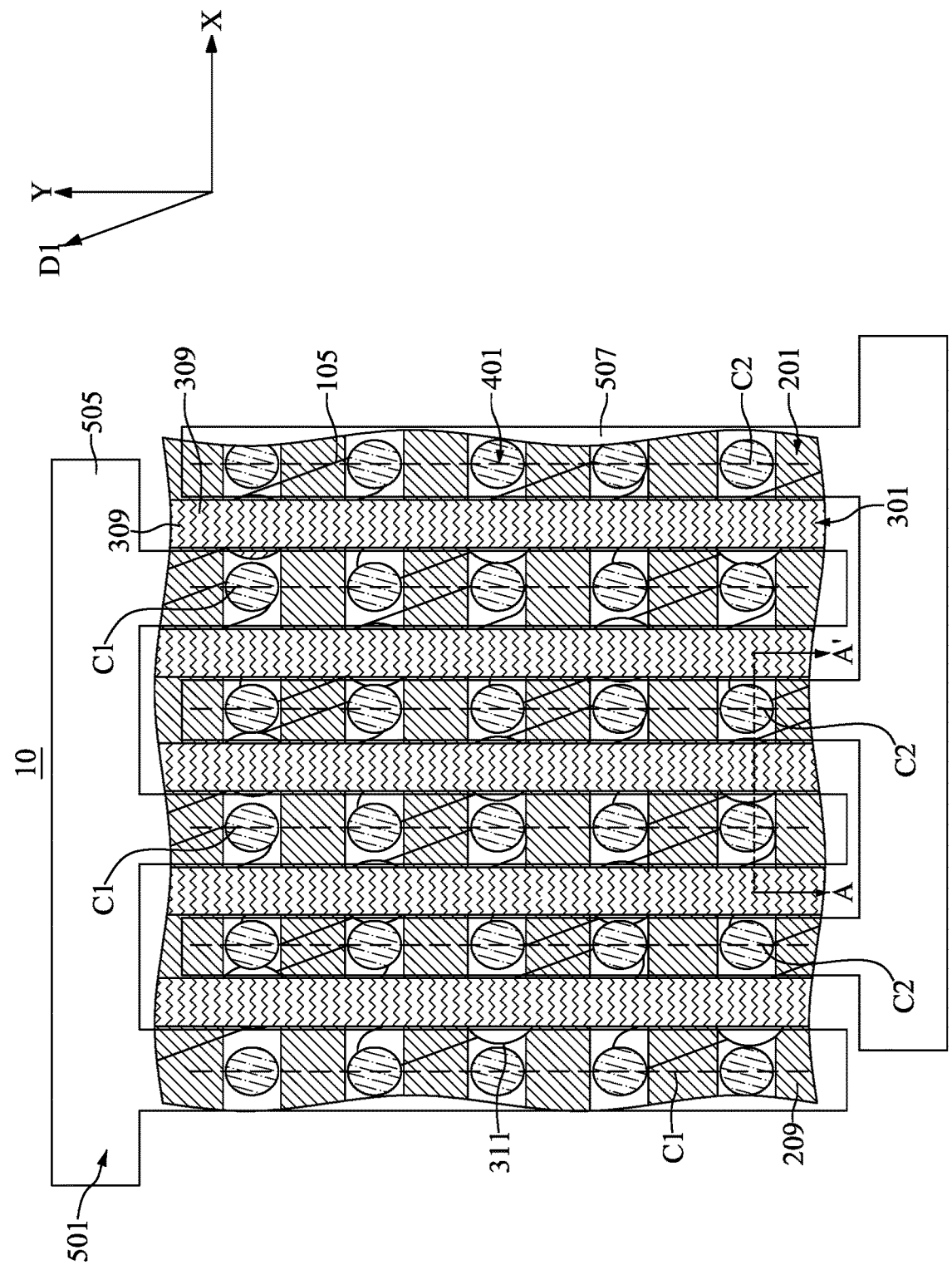
FIG. 28 illustrates, in a schematic close-up top-view diagram, an intermediate semiconductor device of the first testing area in accordance with one embodiment of the present disclosure.
Figure 29:
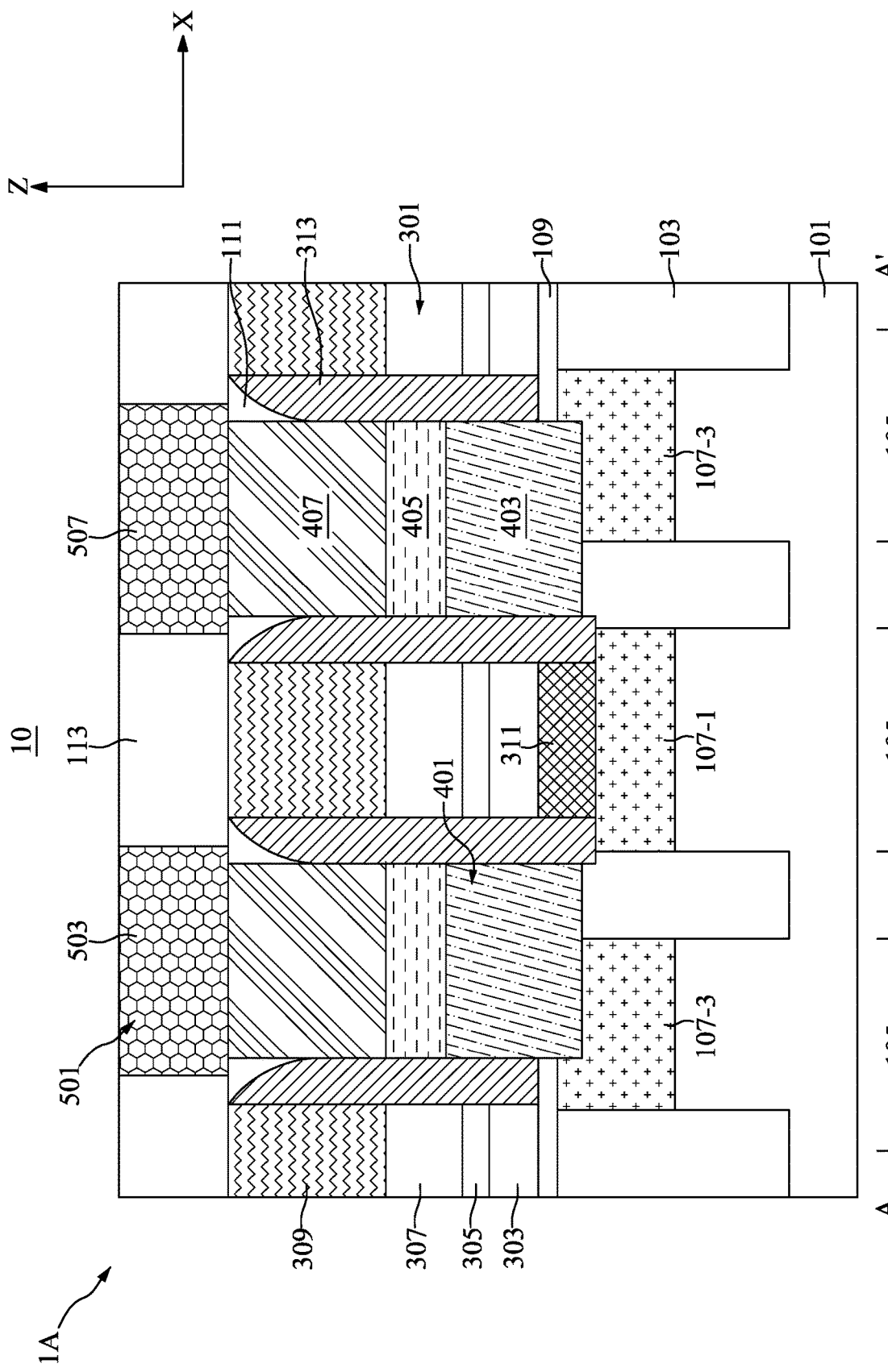
FIG. 29 is a schematic cross-sectional view diagram taken along the line A-A' in FIG. 28.

FIG. 28 illustrates, in a schematic close-up top-view diagram, an intermediate semiconductor device of the first testing area 10 in accordance with one embodiment of the present disclosure. FIG. 29 is a schematic cross-sectional view diagram taken along the line A-A' in FIG. 28 illustrating part of the flow for fabricating the semiconductor device 1A in accordance with one embodiment of the present disclosure.

With reference to FIGS. 1, 27, and 28, at step S23, a first testing structure 501 may be formed on the capacitor contact structures 401.

With reference to FIGS. 27 and 28, a second insulating layer 113 may be formed over the intermediate semiconductor device illustrated in FIGS. 25 to 27. The second insulating layer 113 may be formed of a same material as the first insulating layer 111 but is not limited thereto. The first testing structure 501 may be formed in the second insulating layer 113 by a damascene process.

With reference to FIGS. 27 and 28, the first testing structure 501 may include first drain portions 503, a connecting portion 505, first source portions 507, and a connecting portion 509. The first drain portions 503, the connecting portion 505, the first source portions 507, and the connecting portion 509 may be formed of, for example, copper, aluminum, the like, or a combination thereof.

In a top-view perspective, the first drain portions 503 may be extended along the second axis Y and may be formed on the first columns C1 of capacitor contact structures 401. Each of the first drain portions 503 may be formed on corresponding one column of the first columns C1 of capacitor contact structures 401. The first drain portions 503 may be parallel to each other. The connecting portion 505 may be extended along the first axis X and connect the upper ends of the first drain portions 503. The first drain portions 503 and the connecting portion 505 together form a drain electrode of the first testing structure 501. The drain electrode may have a comb shape.

The first source portions 507 may be extended along the second axis Y and may be formed on the second columns C2 of capacitor contact structures 401. Each of the first source portions 507 may be formed on corresponding one column of the second columns C2 of capacitor contact structures 401. The first source portions 507 may be parallel to each other. The first source portions 507 and the first drain portions 503 may be alternatively arranged along the first axis X. The connecting portion 509 may be extended along the first axis X and connect the lowers ends of the first source portions 507. The first source portions 507 and the connecting portion 509 together form a source electrode of the first testing structure 501. The source electrode may have a comb shape.

As the dimensions of semiconductor devices are continuously being scaled down, the leakage current, which may seriously affect the reliability and yield of the semiconductor devices, may occur between adjacent capacitor contact structures 401. For example, a first type of leakage current may occur from one capacitor contact structure 401, along the first axis X and through the bit line structure 301, to an adjacent one of the capacitor contact structure 401. For another example, a second type of leakage current may occur from one capacitor contact structure 401, along the first axis X and detouring to the bottom surface of the isolation layer 103, to an adjacent one of the capacitor contact structure 401. The first type of leakage current may be greater than the second type of leakage current.

The first testing structure 501 may be used to measure the first type of leakage current and the second type of leakage current. In the present embodiment, the first testing structure 501 may be suitable for detecting leakage current along the first axis X. During operating the first testing structure 501, an external voltage may be applied to the drain electrode and the source electrode may be grounded. If there is no leakage between adjacent capacitor contact structures 401, no current signal can be detected through the first testing structure 501. If there is leakage between adjacent capacitor contact structures 401, the leakage current may be induced by the external voltage and a current path between the drain electrode and the source electrode may be established. As a result, a current signal can be detected by the first testing structure 501. The leakage type can be determined by the value of the detected current signal and the number of the capacitor contact structures 401 connected to the first testing structure 501.

With the assistance of the first testing structure 501, defects such as the leakage may be monitored before formation of capacitors. Due to such defect can be monitored in advance, rework process or decision of abandon can be conducted according to monitored result. As a result, the reliability and yield of the semiconductor device 1A may be improved.

Figure 30:
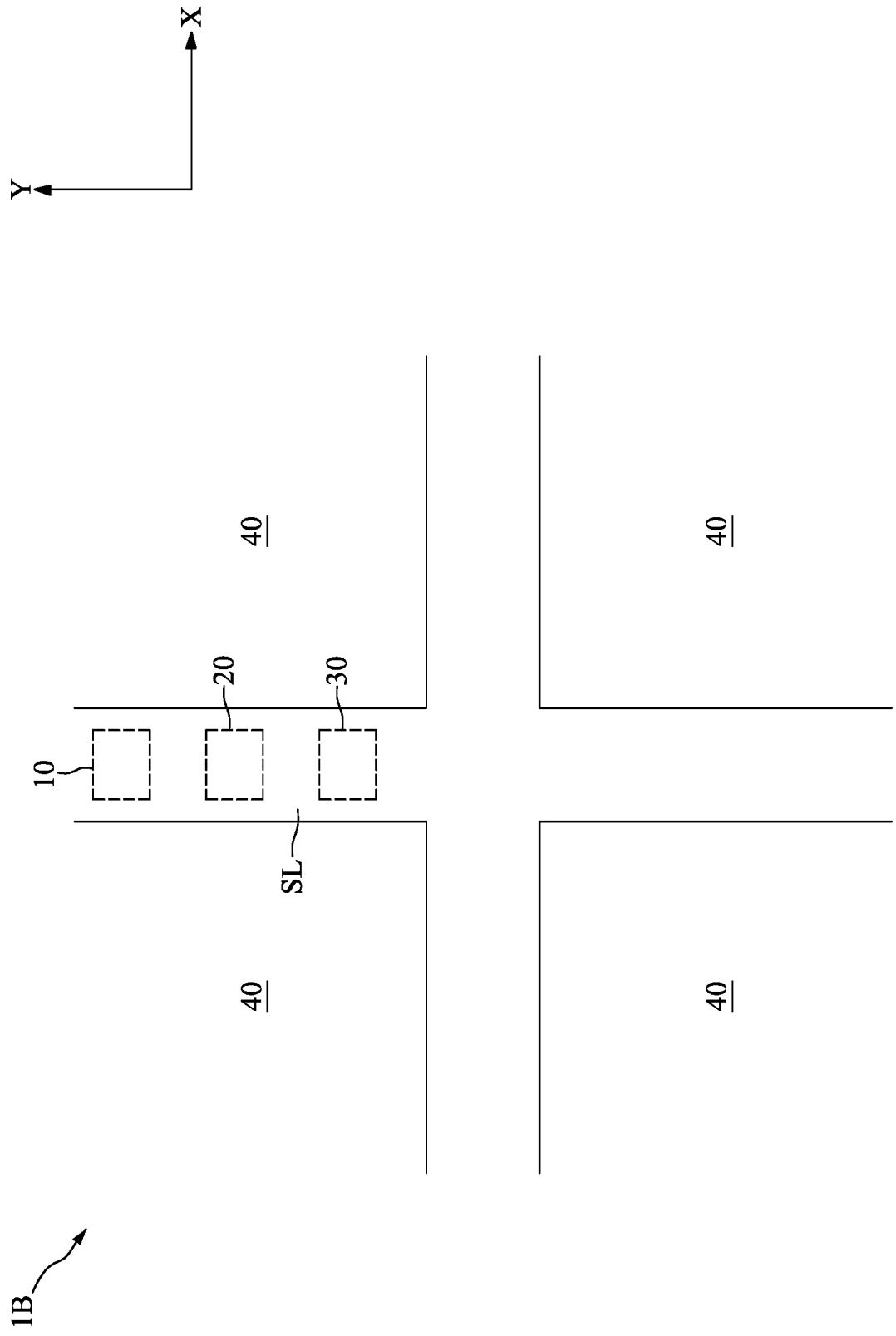
FIG. 30 illustrates, in a schematic top-view diagram, a semiconductor device in accordance with another embodiment of the present disclosure.

FIG. 30 illustrates, in a schematic top-view diagram, a semiconductor device 1B in accordance with another embodiment of the present disclosure.

With reference to FIG. 30, in a top-view perspective, the semiconductor device 1B may include die areas 40 and scribe lines SL. The scribe lines SL may be located between the die areas 40. A first testing area 10, a second testing area 20, and a third testing area 30 may be located in the scribe lines SL, respectively. The first testing area 10, the second testing area 20, and the third testing area 30 may be adjacent to each other but are not limited thereto.

Figure 31:
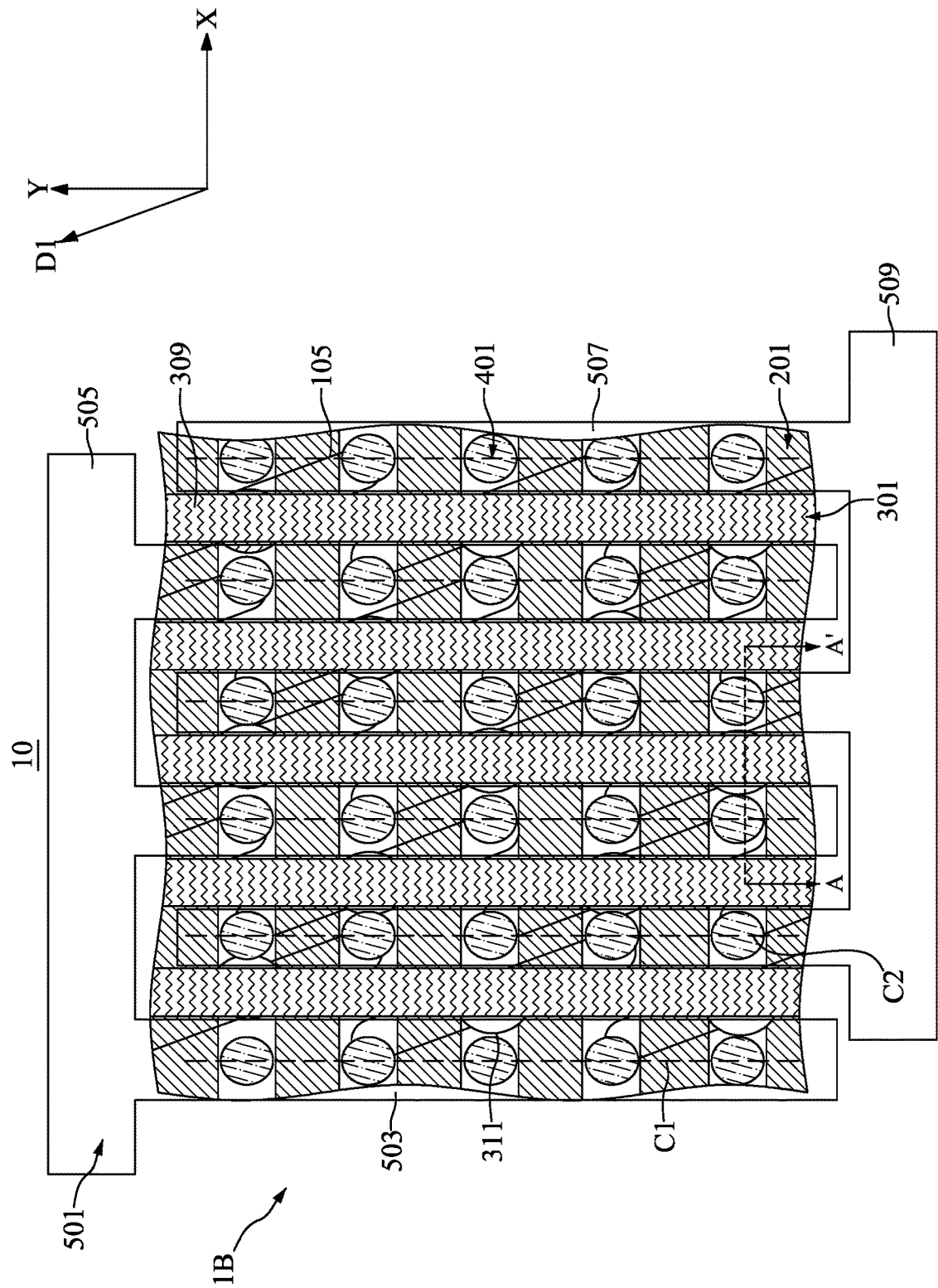
FIG. 31 illustrates, in a schematic close-up top-view diagram, a first testing area in FIG. 30.
Figure 32:
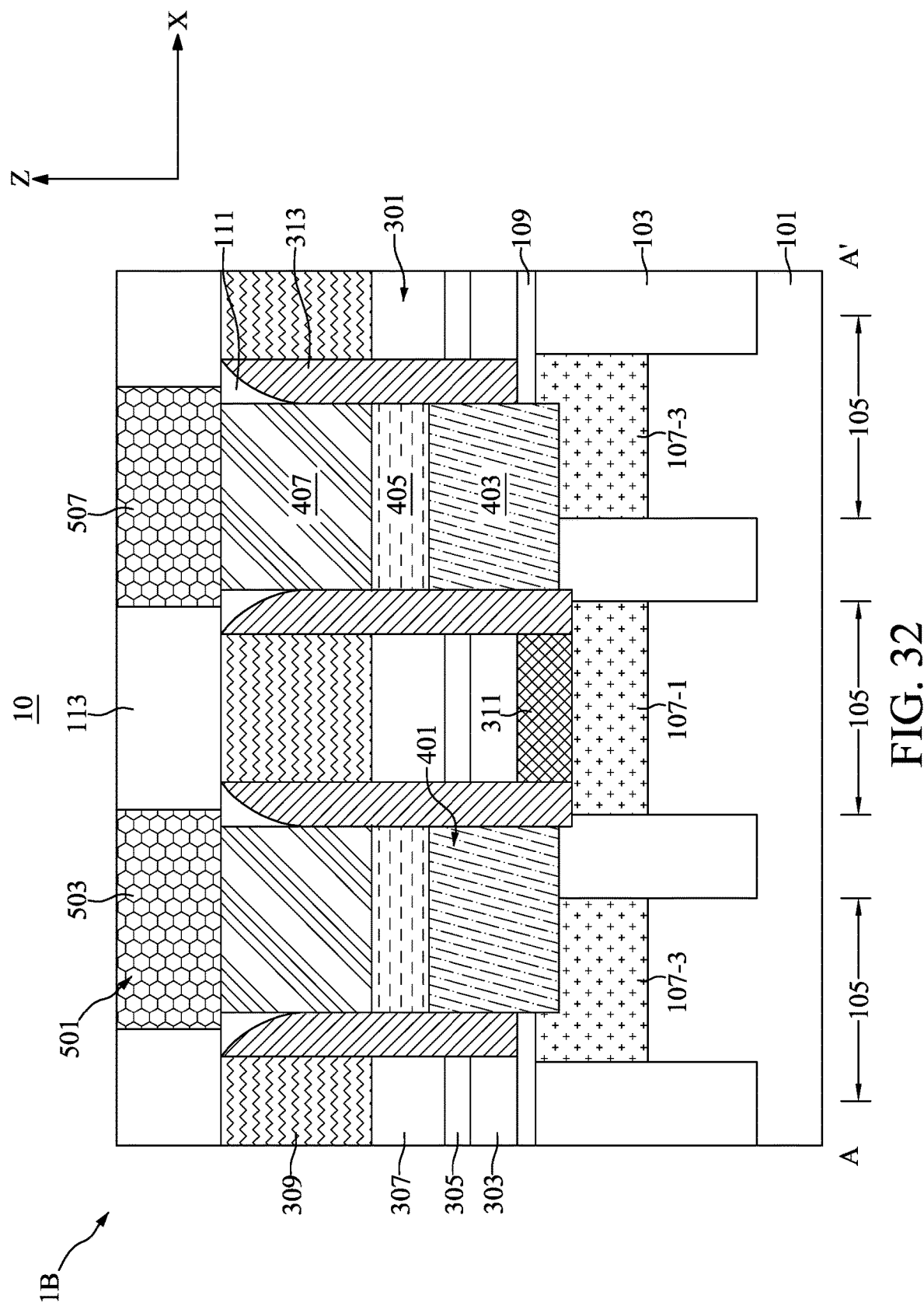
FIG. 32 is a schematic cross-sectional view diagram taken along the line A-A' in FIG. 31.

FIG. 31 illustrates, in a schematic close-up top-view diagram, the first testing area 10 in FIG. 30. FIG. 32 is a schematic cross-sectional view diagram taken along the line A-A' in FIG. 31 illustrating the semiconductor device 1B in accordance with another embodiment of the present disclosure.

With reference to FIGS. 31 and 32, the first testing structure 501 may be formed in the first testing area 10. The first testing structure 501 may have a structure similar to that illustrated in FIGS. 28 and 29. The first testing structure 501 may suitable for detecting leakage current along the first axis X.

Figure 33:
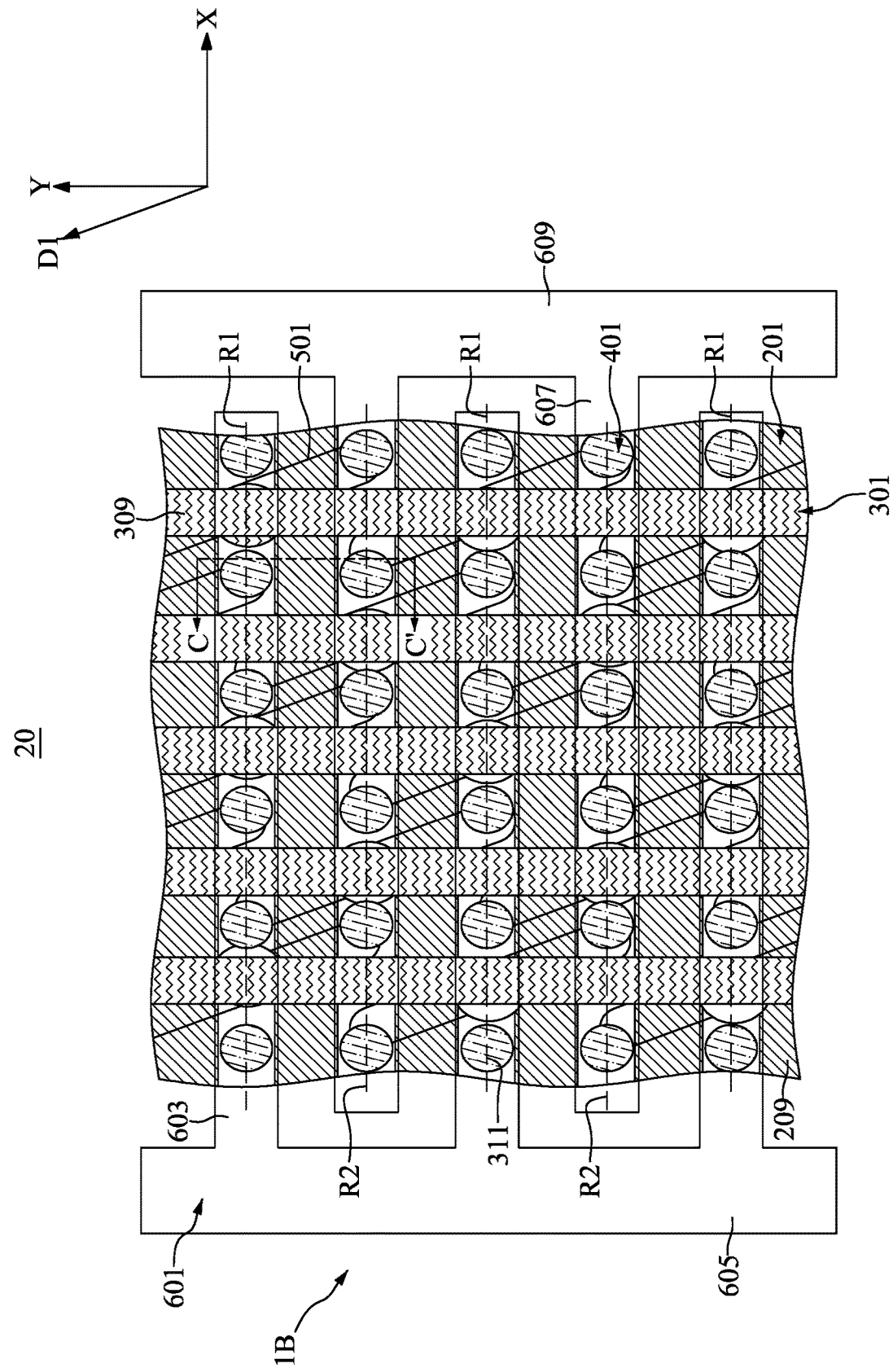
FIG. 33 illustrates, in a schematic close-up top-view diagram, a second testing area in FIG. 30.
Figure 34:
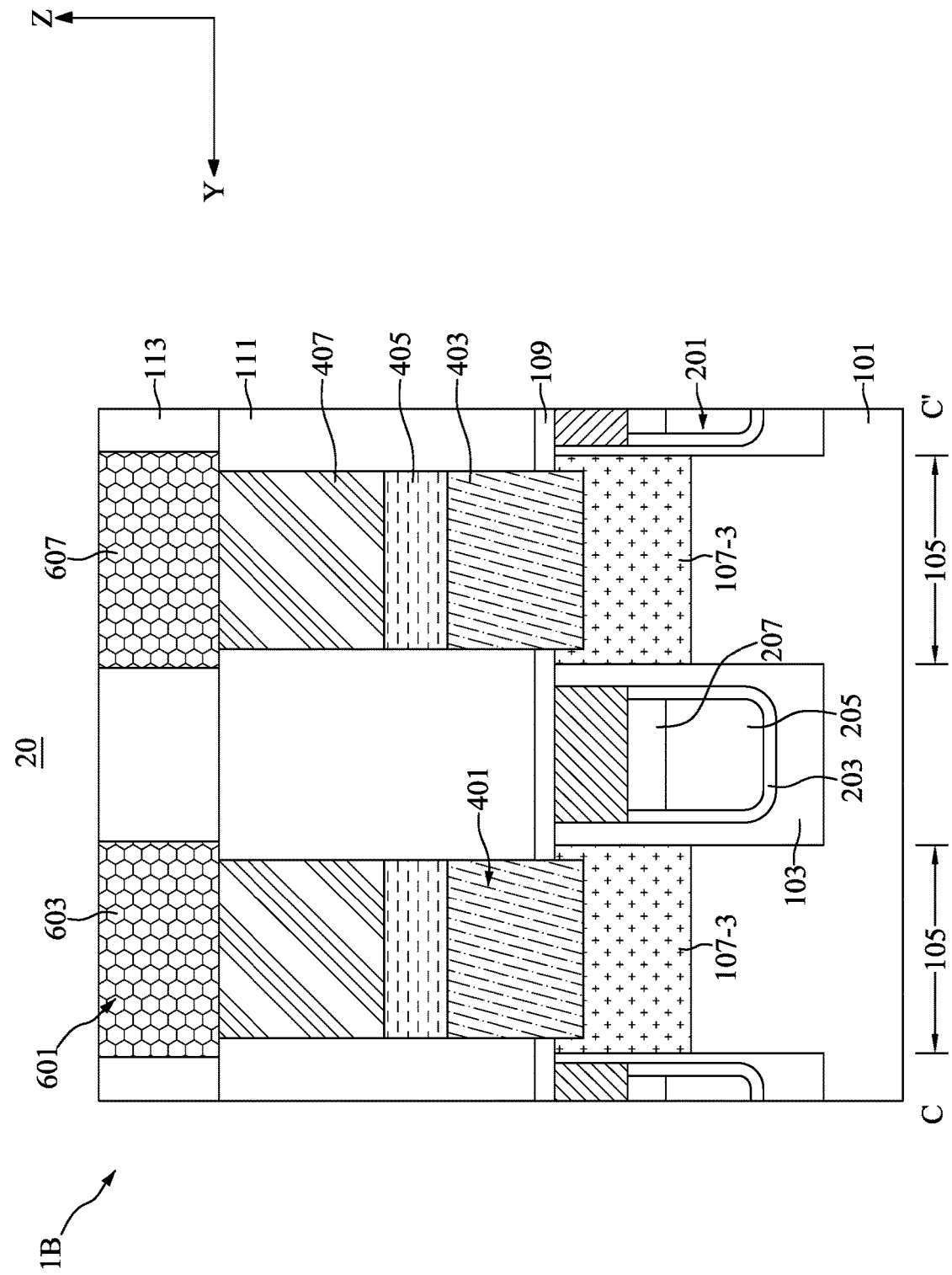
FIG. 34 is a schematic cross-sectional view diagram taken along the line C-C' in FIG. 33.

FIG. 33 illustrates, in a schematic close-up top-view diagram, the second testing area 20 in FIG. 30. FIG. 34 is a schematic cross-sectional view diagram taken along the line C-C' in FIG. 33 illustrating the semiconductor device 1B in accordance with another embodiment of the present disclosure.

With reference to FIGS. 33 and 34, the capacitor contact structures 401 in the second testing area 20 may be categorized into two groups, for example, first rows R1 of capacitor contact structures 401 and second rows R2 of capacitor contact structures 401. Each row of the first rows R1 of capacitor contact structures 401 may include multiple capacitor contact structures 401 that arranged along the first axis X. The first rows R1 of capacitor contact structures 401 may parallel to each other. Each row of the second rows R2 of capacitor contact structures 401 may include multiple capacitor contact structures 401 that arranged along the first axis X. The second rows R2 of capacitor contact structures 401 may parallel to each other. The first rows R1 of capacitor contact structures 401 and the second rows R2 of capacitor contact structures 401 may be alternatively arranged along the second axis Y.

With reference to FIGS. 33 and 34, the second testing structure 601 may be formed in the second testing area 20 and may include second drain portions 603, a connecting portion 605, second source portions 607, and a connecting portion 609. In a top-view perspective, the second drain portions 603 may be extended along the first axis X and may be formed on the first rows R1 of capacitor contact structures 401. Each of the second drain portions 603 may be formed on corresponding one row of the first rows R1 of capacitor contact structures 401. The second drain portions 603 may be parallel to each other. The connecting portion 605 may be extended along the second axis Y and connect the left ends of the second drain portions 603. The second drain portions 603 and the connecting portion 605 together form a drain electrode of the second testing structure 601. The drain electrode may have a comb shape.

The second source portions 607 may be extended along the first axis X and may be formed on the second rows R2 of capacitor contact structures 401. Each of the second source portions 607 may be formed on corresponding one row of the second rows R2 of capacitor contact structures 401. The second source portions 607 may be parallel to each other. The second source portions 607 and the second drain portions 603 may be alternatively arranged along the second axis Y. The connecting portion 609 may be extended along the second axis Y and connect the right ends of the second source portions 607. The second source portions 607 and the connecting portion 609 together form a source electrode of the second testing structure 601. The source electrode may have a comb shape.

Except the leakage current between the adjacent capacitor contact structures 401 and along the first axis X, the leakage current may also occur between the adjacent capacitor contact structures 401 and along the second axis Y. For example, a third type of leakage current may occur from one capacitor contact structure 401, along the second axis Y and through the first insulating layer 111, to an adjacent one of the capacitor contact structure 401. For another example, a fourth type of leakage current may occur from one capacitor contact structure 401, along the second type axis Y and detouring to the word line structure 201 and the bottom surface of the isolation layer 103, to an adjacent one of the capacitor contact structure 401. The third type of leakage current may be greater than the fourth type of leakage current.

The second testing structure 601 may be used to measure the third type of leakage current and the fourth type of leakage current. In the present embodiment, the second testing structure 601 may be suitable for detecting leakage current along the second axis Y. During operating the second testing structure 601, an external voltage may be applied to the drain electrode and the source electrode may be grounded. If there is no leakage between adjacent capacitor contact structures 401, no current signal can be detected through the second testing structure 601. If there is leakage between adjacent capacitor contact structures 401, the leakage current may be induced by the external voltage and a current path between the drain electrode and the source electrode may be established. As a result, a current signal can be detected by the second testing structure 601. The leakage type can be determined by the value of the detected current signal, in the presence of a voltage applied to the word line structure 201 or without a voltage applied to the word line structure 201, and the number of the capacitor contact structures 401 connected to the first testing structure 501.

Figure 35:
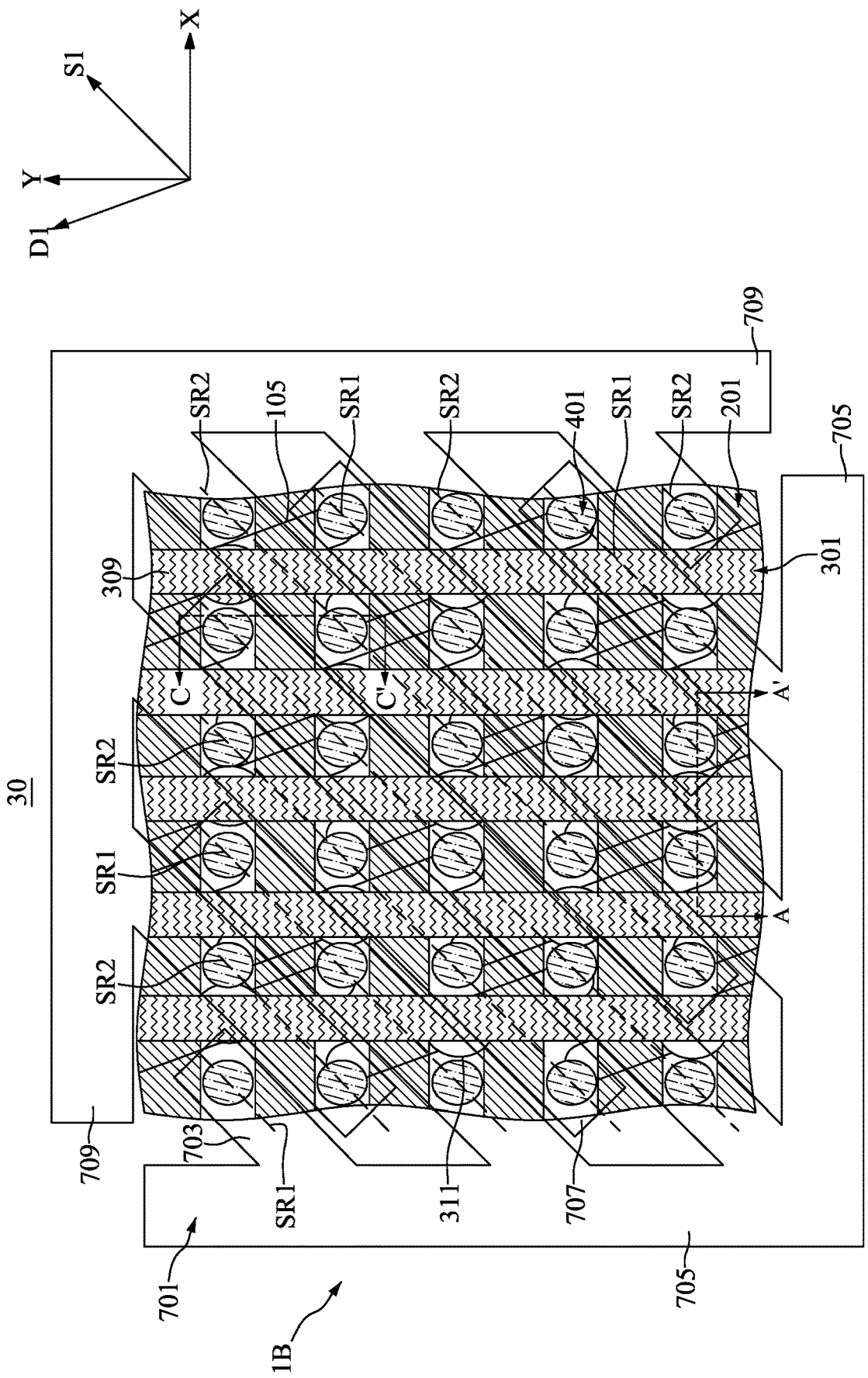
FIG. 35 illustrates, in a schematic close-up top-view diagram, a third testing area in FIG. 30.
Figure 36:
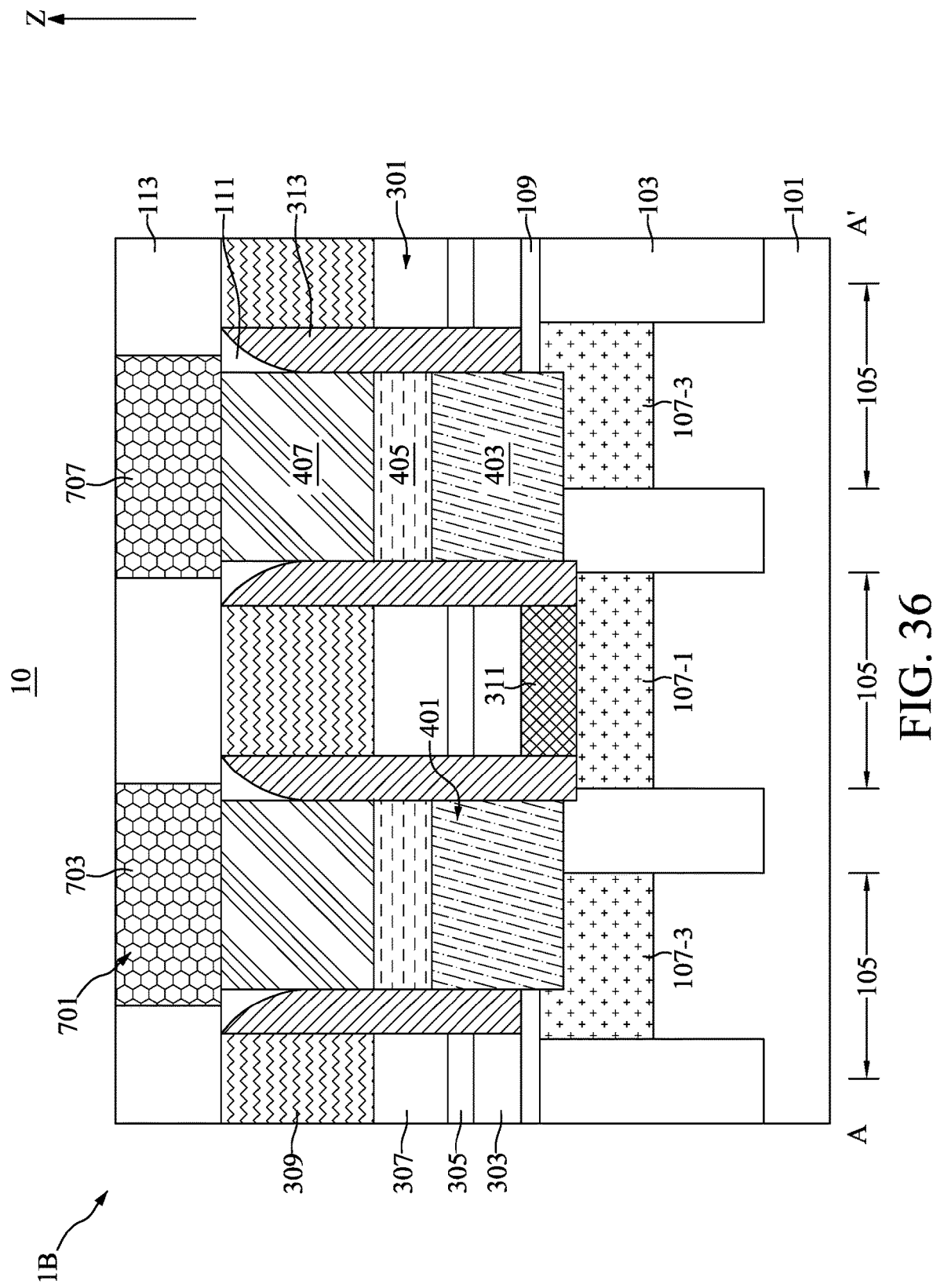
FIGS. 36 and 37 are schematic cross-sectional view diagrams respectively taken along the line A-A' and the line C-C' in FIG. 35.
Figure 37:
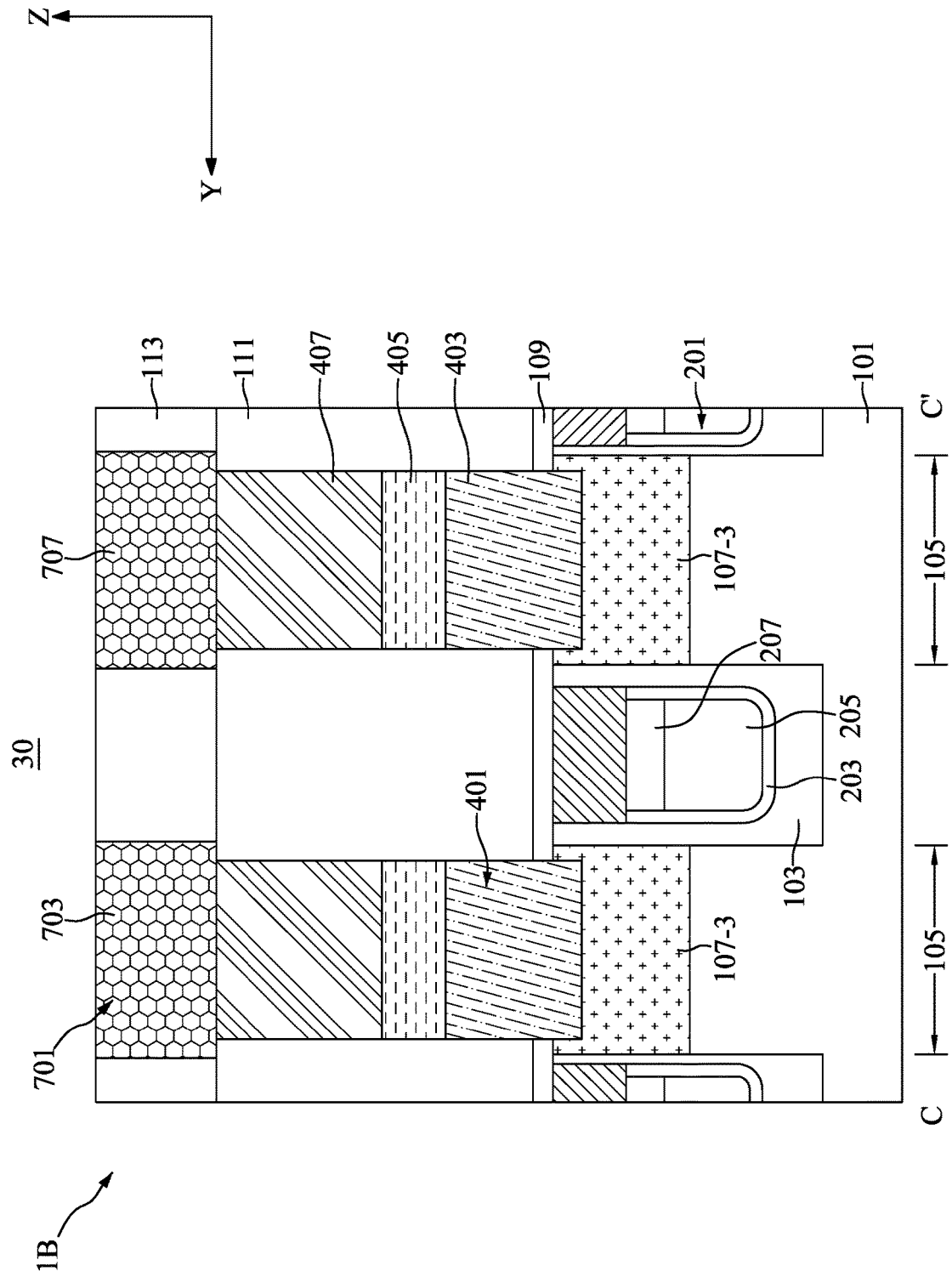

FIG. 35 illustrates, in a schematic close-up top-view diagram, the third testing area 30 in FIG. 30. FIGS. 36 and 37 are schematic cross-sectional view diagrams respectively taken along the line A-A' and the line C-C' in FIG. 35 illustrating the semiconductor device 1B in accordance with another embodiment of the present disclosure.

With reference to FIGS. 35 to 37, the capacitor contact structures 401 in the third testing area 30 may be categorized into two groups, for example, first slanted rows SR1 of capacitor contact structures 401 and second slanted rows SR2 of capacitor contact structures 401. Each slanted row of the first slanted rows SR1 of capacitor contact structures 401 may include multiple capacitor contact structures 401 that arranged along a first direction S1. The first direction S1 may be slanted with respect to the first axis X and the second axis Y. The first direction S1 and the tilted direction D1 may be intersected. The first slanted rows R1 of capacitor contact structures 401 may parallel to each other. Each slanted row of the second slanted rows SR2 of capacitor contact structures 401 may include multiple capacitor contact structures 401 that arranged along the first direction S1. The second slanted rows SR2 of capacitor contact structures 401 may parallel to each other. The first slanted rows SR1 of capacitor contact structures 401 and the second slanted rows SR2 of capacitor contact structures 401 may be alternatively arranged along a direction perpendicular to the first direction S1.

With reference to FIGS. 35 to 37, the third testing structure 701 may be formed in the third testing area 30 and may include third drain portions 703, a connecting portion 705, third source portions 707, and a connecting portion 709. In a top-view perspective, the third drain portions 703 may be extended along the first direction S1 and may be formed on the first slanted rows SR1 of capacitor contact structures 401. Each of the third drain portions 703 may be formed on corresponding one slanted row of the first slanted rows SR1 of capacitor contact structures 401. The third drain portions 703 may be parallel to each other. The connecting portions 705 may include a vertical portion extended along the second axis Y and a horizontal portion extended along the first axis X. The connecting portion 705 may be L-shape in a top-view perspective. In the present embodiment, the connecting portion 705 may connected to the left ends of the third drain portions 703. The third drain portions 703 and the connecting portion 705 together form a drain electrode of the third testing structure 701.

The third source portions 707 may be extended along the first direction S1 and may be formed on the second slanted rows SR2 of capacitor contact structures 401. Each of the third source portions 707 may be formed on corresponding one slanted row of the second slanted rows SR2 of capacitor contact structures 401. The third source portions 707 may be parallel to each other. The third source portions 707 and the third drain portions 703 may be alternatively arranged along the direction perpendicular to the first direction S1. The connecting portion 709 may include a vertical portion extended along the second axis Y and a horizontal portion extended along the first axis X. The connecting portion 709 may be L-shape in a top-view perspective. In the present embodiment, the connecting portion 709 may connected to the right ends of the third source portions 707. The third source portions 707 and the connecting portion 709 together form a source electrode of the third testing structure 701.

The third testing structure 701 may be used to measure the first type of leakage current, the second type of leakage current, the third type of leakage current, and the fourth type of leakage current. The presence of the first testing structure 501, the second testing structure 601, and the third testing structure 701 may make the semiconductor device 1B suitable for detecting all types of leakage.

In some embodiments, a semiconductor device may only include the second testing structure 601. In some embodiments, a semiconductor device may only include the third testing structure 701. In some embodiments, a semiconductor device may only include the first testing structure 501 and the second testing structure 601. In some embodiments, a semiconductor device may only include the first testing structure 501 and the third testing structure 701. In some embodiments, a semiconductor device may only include the second testing structure 601 and the third testing structure 701.

Figure 38:
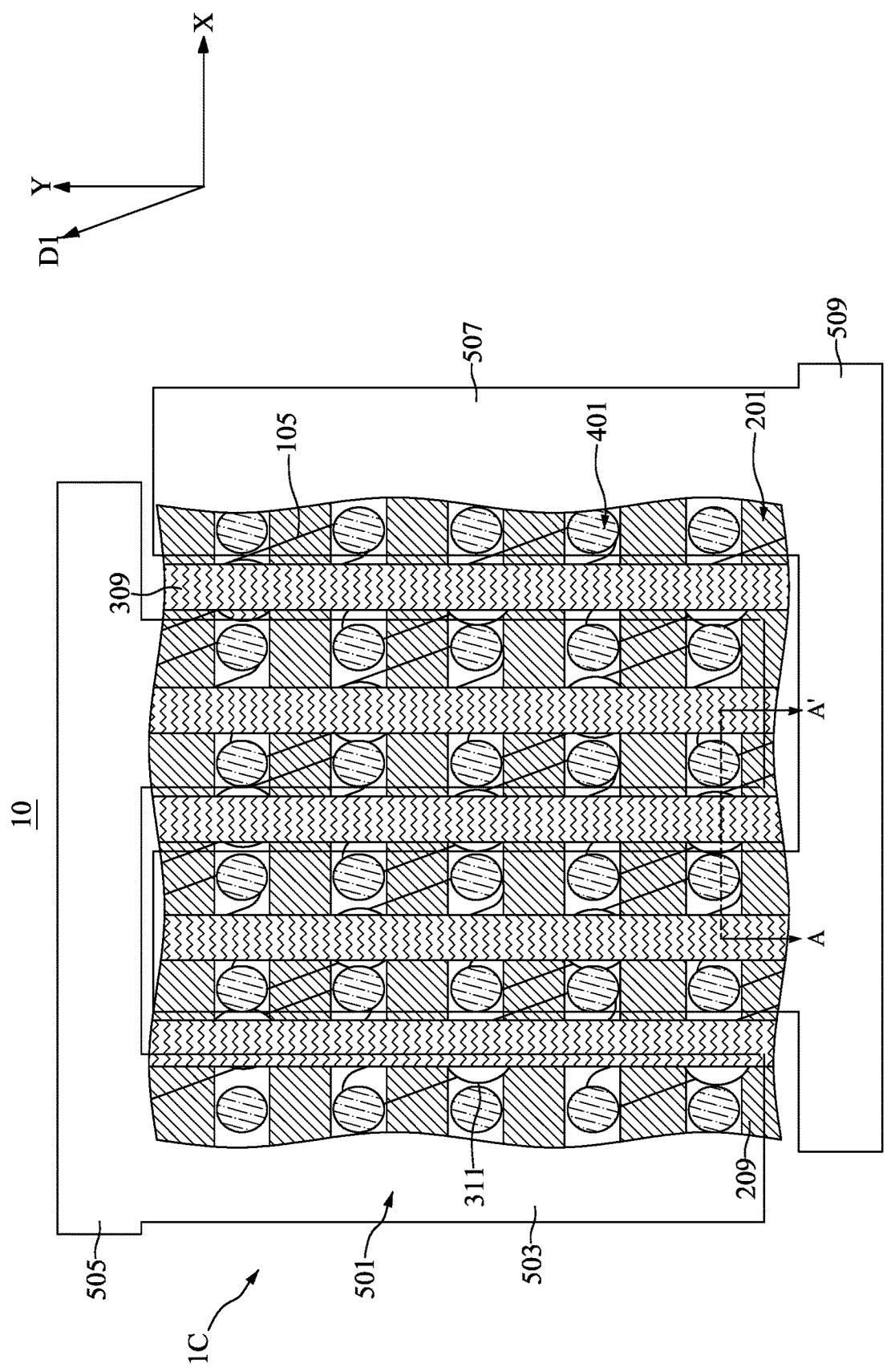
FIG. 38 illustrates, in a schematic close-up top-view diagram, a first testing area of a semiconductor device in accordance with another embodiment of the present disclosure.

FIG. 38 illustrates, in a schematic close-up top-view diagram, a first testing area 10 of a semiconductor device 1C in accordance with another embodiment of the present disclosure.

With reference to FIG. 38, the first testing structure 501 may be similar to that illustrated in FIG. 28. Specifically, in a top-view perspective, each of the first drain portions 503 and each of the first source portions 507 may be formed on two columns of the capacitor contact structures 401. The first testing structure 501 may be suitable for detecting leakage current along the first axis X.

Figure 39:
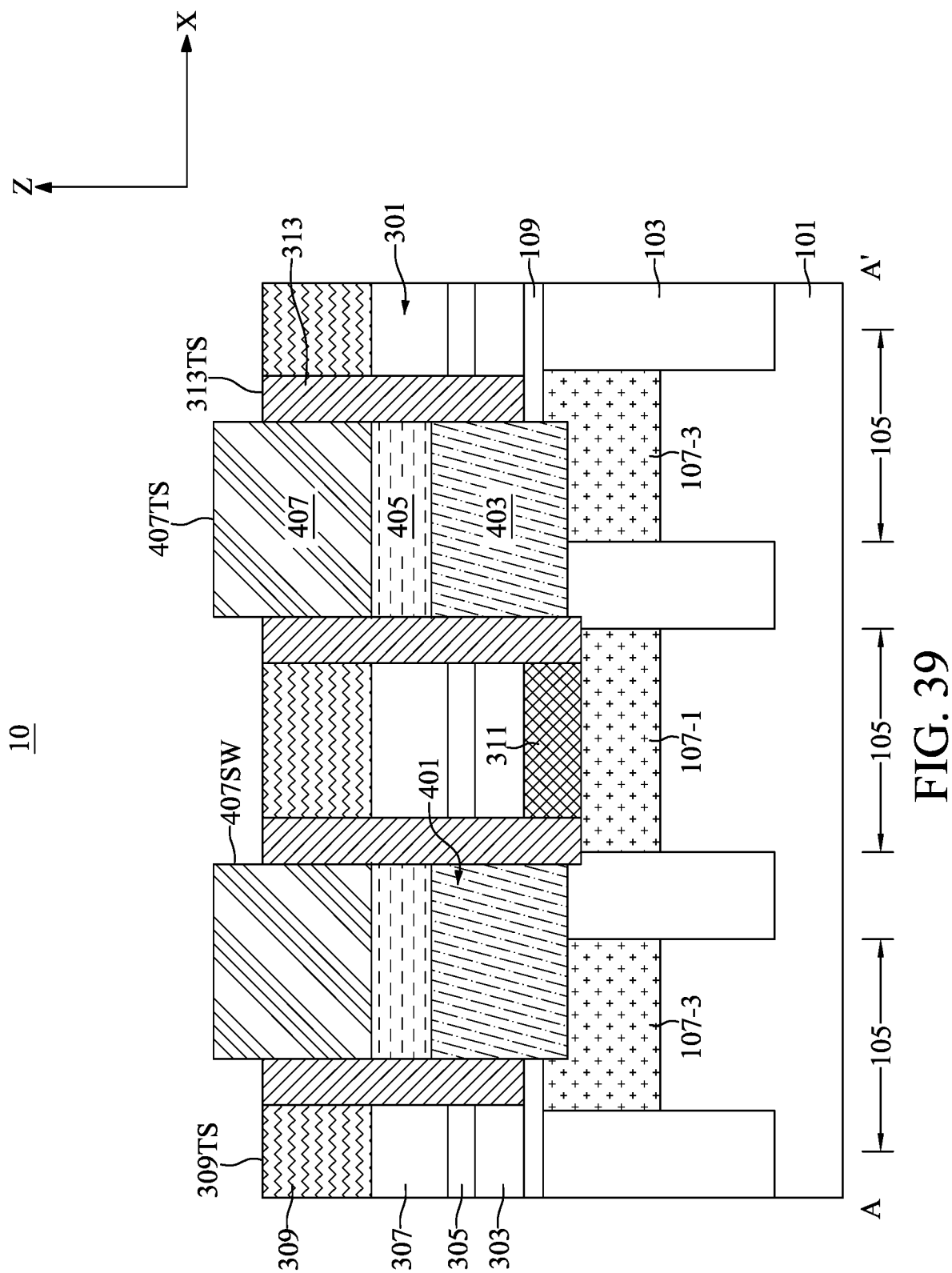
FIGS. 39 and 40 are schematic cross-sectional view diagrams taken along the line A-A' in FIG. 25.
Figure 40:
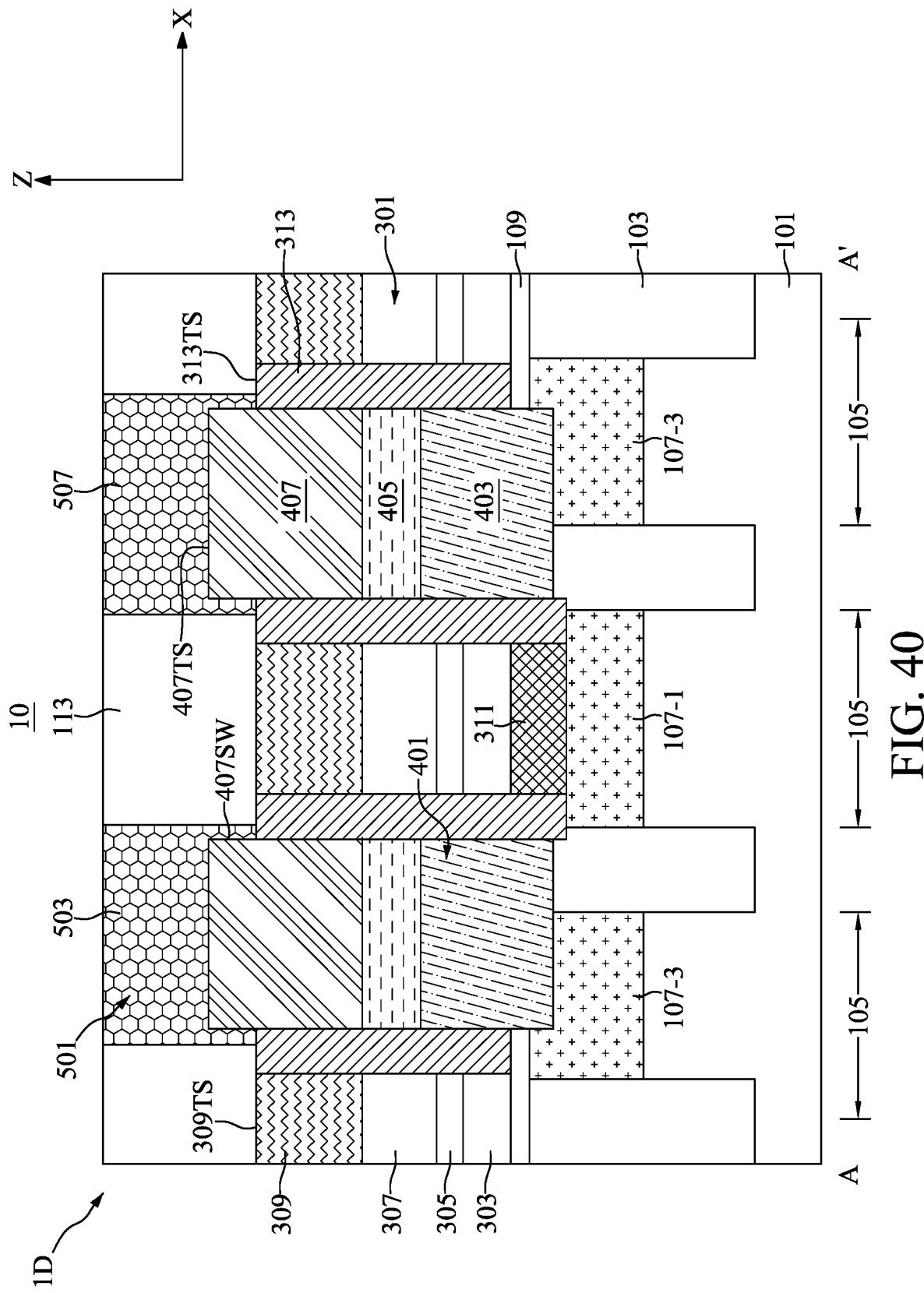

FIGS. 39 and 40 are schematic cross-sectional view diagrams taken along the line A-A' in FIG. 25 illustrating part of the flow for fabricating the semiconductor device 1D in accordance with another embodiment of the present disclosure.

With reference to FIG. 39, an intermediate semiconductor device may be fabricating with a procedure similar to that illustrated in FIGS. 2 to 27. A recessing process may be performed to recess the top surfaces 309TS of the bit line capping layers 309 and the top surfaces 313TS of the bit line spacers 313. The top surfaces 407TS of the contact top conductive layers 407 may be at a vertical level higher than a vertical level of the top surfaces 309TS of the bit line capping layers 309 and the top surfaces 313TS of the bit line spacers 313.

With reference to FIG. 40, the second insulating layer 113 and the first testing structure 501 may be formed with a procedure similar to that illustrated in FIGS. 28 and 29. The first drain portions 503 and the first source portions 507 may formed covered the top surfaces 407TS of the contact top conductive layers 407 and the sidewalls 407SW of the contact top conductive layers 407. That is, the contact surfaces between the capacitor contact structures 401 and the first testing structure 501 may be increased. As a result, the sensitivity of the first testing structure 501 may be increased.

Figure 41:
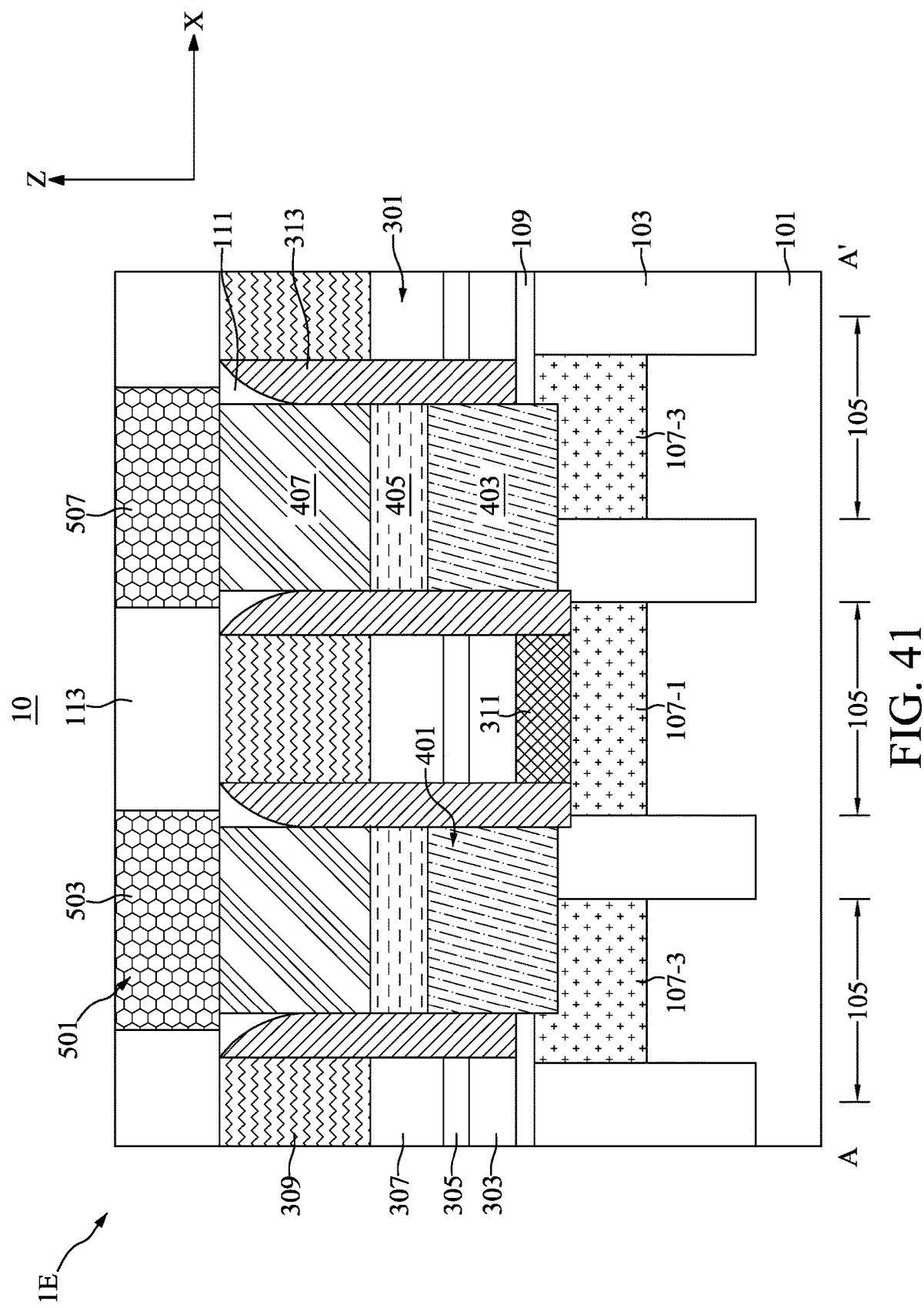
FIG. 41 is a schematic cross-sectional view diagram taken along the line A-A' in FIG. 28.

FIG. 41 is a schematic cross-sectional view diagram taken along the line A-A' in FIG. 28 illustrating a semiconductor device 1E in accordance with one embodiment of the present disclosure.

With reference to FIG. 41, the capacitor contact structures 401 may be formed on the substrate 101 instead of extending to the substrate 101 as illustrated in FIG. 26.

Due to the design of the semiconductor device of the present disclosure, leakage between adjacent capacitor contact structures 401 may be detected. As a result, the reliability and yield of the semiconductor device 1A may be improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device, comprising:
   a first testing area;
   a word line structure positioned in the first testing area and arranged parallel to a first axis;
   a first column of capacitor contact structures positioned in the first testing area and arranged parallel to a second axis perpendicular to the first axis;
   a second column of capacitor contact structures positioned adjacent to the first column of capacitor contact structures and arranged parallel to the first column of capacitor contact structures;
   a first testing structure comprising a first drain portion extended along the second axis and a first source portion extended along the second axis; and
   a substrate wherein the first column of capacitor contact structures is positioned on the substrate and the word line structure is positioned in the substrate;
   wherein the first drain portion is positioned on the first column of capacitor contact structures and the first source portion is positioned on the second column of capacitor contact structures.

2. The semiconductor device of claim 1, wherein the first testing area is positioned in a scribe line.

3. The semiconductor device of claim 2, further comprising:
   a second testing area positioned in the scribe line;
   a first row of capacitor contact structures positioned in the second testing area and arranged parallel to the first axis;
   a second row of capacitor contact structures positioned adjacent to the first row of capacitor contact structures and arranged parallel to the first row of capacitor contact structures; and
   a second testing structure comprising a second drain portion extended along the first axis and a second source portion extended along the first axis;
   wherein the second drain portion is positioned on the first row of capacitor contact structures and the second source portion is positioned on the second row of capacitor contact structures.

4. The semiconductor device of claim 3, further comprising:
   a third testing area positioned in the scribe line;
   a first slanted row of capacitor contact structures positioned in the third testing area and arranged parallel to a first direction slanted with respect to the first axis and the second axis;
   a second slanted row of capacitor contact structures positioned adjacent to the first slanted row of capacitor contact structures and arranged parallel to the first slanted row of capacitor contact structures; and
   a third testing structure comprising a third drain portion extended along the first direction and a third source portion extended along the first direction;
   wherein the third drain portion is positioned on the first slanted row of capacitor contact structures and the third source portion is positioned on the second slanted row of capacitor contact structures.

5. A semiconductor device, comprising:
   a first testing area;
   a word line structure positioned in the first testing area and arranged parallel to a first axis;
   a first column of capacitor contact structures positioned in the first testing area and arranged parallel to a second axis perpendicular to the first axis;
   a second column of capacitor contact structures positioned adjacent to the first column of capacitor contact structures and arranged parallel to the first column of capacitor contact structures; a first testing structure comprising a first drain portion extended along the second axis and a first source portion extended along the second axis; and
   a substrate, wherein the first column of capacitor contact structures is extended to an upper portion of the substrate and the word line structure is positioned in the substrate;
   wherein the first drain portion is positioned on the first column of capacitor contact structures and the first source portion is positioned on the second column of capacitor contact structures.

6. The semiconductor device of claim 5, further comprising a bit line structure positioned between the first column of capacitor contact structures and the second column of capacitor contact structures.

7. The semiconductor device of claim 6, further comprising an etching stop layer positioned between the bit line structure and the substrate.

8. The semiconductor device of claim 6, further comprising bit line spacers positioned on sidewalls of the bit line structure.

9. The semiconductor device of claim 8, wherein the bit line structure comprises a bit line bottom conductive layer positioned on the substrate, a bit line middle conductive layer positioned on the bit line bottom conductive layer, a bit line top conductive layer positioned on the bit line middle conductive layer, and a bit line capping layer positioned on the bit line top conductive layer.

10. The semiconductor device of claim 9, further comprising a bit line contact positioned under the bit line bottom conductive layer.

11. The semiconductor device of claim 10, wherein the word line structure comprises a word line dielectric layer inwardly positioned in the substrate, a word line bottom conductive layer positioned on the word line dielectric layer, a word line top conductive layer positioned on the word line bottom conductive layer, and a word line capping layer positioned on the word line top conductive layer.

12. The semiconductor device of claim 11, further comprising drain regions positioned under the first column of capacitor contact structures.

13. The semiconductor device of claim 12, wherein the first column of capacitor contact structures comprises polycrystalline silicon, polycrystalline germanium, polycrystalline silicon germanium, titanium nitride, tantalum nitride, cobalt silicide, titanium silicide, nickel silicide, nickel platinum silicide, or tantalum silicide.

14. A method for fabricating a semiconductor device, comprising:

providing a substrate;

forming a word line structure in the substrate and arranged parallel to a first axis;

forming a first column of capacitor contact structures on the substrate and arranged parallel to a second axis perpendicular to the first axis and forming a second column of capacitor contact structures adjacent to the first column of capacitor contact structures and arranged parallel to the first column of capacitor contact structures; and forming a first drain portion extended along the second axis and on the first column of capacitor contact structures and forming a first source portion extended along the second axis and on the second column of capacitor contact structures;

wherein the first drain portion and the first source portion together form a first testing structure.

15. The method for fabricating the semiconductor device of claim 14, wherein the first drain portion and the first source portion are formed of copper, aluminum, or a combination thereof.

16. The method for fabricating the semiconductor device of claim 15, wherein the first column of capacitor contact structures comprises polycrystalline silicon, polycrystalline germanium, polycrystalline silicon germanium, titanium nitride, tantalum nitride, cobalt silicide, titanium silicide, nickel silicide, nickel platinum silicide, or tantalum silicide.

* * * * *